(12) United States Patent
Kishi et al.

(10) Patent No.: US 10,355,640 B2
(45) Date of Patent: Jul. 16, 2019

(54) CRYSTAL OSCILLATOR DEVICE AND METHOD OF MEASURING CRYSTAL OSCILLATOR CHARACTERISTIC

(71) Applicant: FUJITSU LIMITED, Kawasaki-shi, Kanagawa (JP)

(72) Inventors: Masakazu Kishi, Kawasaki (JP); Hajime Kubota, Kawasaki (JP); Masayuki Itoh, Kawasaki (JP); Yoshinori Mesaki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 42 days.

(21) Appl. No.: 15/602,158

(22) Filed: May 23, 2017

(65) Prior Publication Data

US 2017/0359021 A1    Dec. 14, 2017

(30) Foreign Application Priority Data

Jun. 10, 2016 (JP) .................. 2016-116462

(51) Int. Cl.
| | |
|---|---|
| *H03B 1/02* | (2006.01) |
| *H03B 5/04* | (2006.01) |
| *H03B 5/32* | (2006.01) |
| *H03G 3/20* | (2006.01) |
| *H03L 5/00* | (2006.01) |

(Continued)

(52) U.S. Cl.
CPC .................. *H03B 1/02* (2013.01); *G01K 7/32* (2013.01); *H03B 5/04* (2013.01); *H03B 5/32* (2013.01); *H03B 5/364* (2013.01); *H03G 3/20* (2013.01); *H03L 5/00* (2013.01);

(Continued)

(58) Field of Classification Search
CPC ... H03B 5/06; H03B 1/02; H03B 5/32; H03B 5/36; H03B 5/364; H03B 2200/0034; H03B 2200/0046; H03L 3/00; H03L 5/00
See application file for complete search history.

(56) References Cited

U.S. PATENT DOCUMENTS

| | | | |
|---|---|---|---|
| 4,144,747 | A | 3/1979 | Datwyler, Jr. |
| 4,678,905 | A | 7/1987 | Phillips |

(Continued)

FOREIGN PATENT DOCUMENTS

| | | |
|---|---|---|
| JP | 1-186003 A | 7/1989 |
| JP | 3-220806 A | 9/1991 |

(Continued)

OTHER PUBLICATIONS

Rowe, Martin, "Check the clock oscillators", May 1, 2007, retrieved from http://www.edn.com/Pdf/ViewPdf?contentItemId=4381286 on Dec. 14, 2018, 2 pages.

(Continued)

*Primary Examiner* — Ryan Johnson
(74) *Attorney, Agent, or Firm* — Fujitsu Patent Center

(57) ABSTRACT

A crystal oscillator device is disclosed. The crystal oscillator device includes: a casing; a crystal piece provided in the casing; a pair of excitation electrodes provided on the crystal piece; a magnetic flux generating member provided on the crystal piece; a coil through which magnetic flux from the magnetic flux generating member passes; and an alarm generator configured to generate an alarm based on a signal whose amplitude is equal to or less than a reference value, the signal being generated in the coil.

18 Claims, 24 Drawing Sheets

(51) Int. Cl.
  *G01K 7/32* (2006.01)
  *H03B 5/36* (2006.01)

(52) U.S. Cl.
  CPC ........... *H03B 2200/0034* (2013.01); *H03B 2200/0046* (2013.01); *H03B 2200/0066* (2013.01)

(56) References Cited

U.S. PATENT DOCUMENTS

| | | | |
|---|---|---|---|
| 5,572,322 A | 11/1996 | Noda | |
| 5,654,678 A | 8/1997 | Miyazaki | |
| 7,859,355 B2 * | 12/2010 | Brennan | H03B 5/06 331/177 V |
| 7,893,784 B2 | 2/2011 | Hirama | |
| 8,456,243 B2 * | 6/2013 | Aleman | H03B 5/36 331/16 |
| 8,564,378 B2 | 10/2013 | Takahashi | |
| 8,928,419 B2 * | 1/2015 | Ishii | H01L 41/0475 310/365 |
| 9,024,695 B2 | 5/2015 | Kishi | |
| 9,520,830 B2 * | 12/2016 | Sato | H03B 5/36 |
| 2007/0040470 A1 | 2/2007 | Watanabe | |
| 2008/0279250 A1 | 11/2008 | Kamei | |
| 2011/0156823 A1 | 6/2011 | Koyama et al. | |
| 2012/0068776 A1 | 3/2012 | Asamura et al. | |
| 2012/0326794 A1 * | 12/2012 | Kammula | H03B 5/362 331/15 |
| 2016/0218671 A1 | 7/2016 | Jun et al. | |
| 2016/0223391 A1 | 8/2016 | Kishi et al. | |
| 2017/0359021 A1 | 12/2017 | Kishi et al. | |
| 2017/0359022 A1 | 12/2017 | Kishi et al. | |
| 2017/0359023 A1 | 12/2017 | Kishi et al. | |
| 2017/0359025 A1 | 12/2017 | Kishi et al. | |
| 2017/0359026 A1 | 12/2017 | Kishi et al. | |
| 2017/0359044 A1 | 12/2017 | Kishi et al. | |
| 2018/0054163 A1 | 2/2018 | Chen et al. | |

FOREIGN PATENT DOCUMENTS

| | | |
|---|---|---|
| JP | 6-177645 A | 6/1994 |
| JP | 8-15122 A | 1/1996 |
| JP | 8-327398 A | 12/1996 |
| JP | 2004-198126 A | 7/2004 |
| JP | 2008-139256 | 6/2008 |
| JP | 2010-232974 A | 10/2010 |
| JP | 2011-135342 A | 7/2011 |
| JP | 2012-70193 A | 4/2012 |
| JP | 2013-106052 A | 5/2013 |
| WO | 2012/042889 A | 4/2012 |

OTHER PUBLICATIONS

U.S. Office Action dated Dec. 20, 2018 for copending U.S. Appl. No. 15/602,173, 11 pages.
U.S. Office Action dated Dec. 4, 2018 for copending U.S. Appl. No. 15/498,679, 23 pages.
U.S. Office Action dated Jan. 7, 2019 for copending U.S. Appl. No. 15/602,202, 9 pages.
U.S. Office Action dated Feb. 1, 2019 for copending U.S. Appl. No. 15/581,908, 10 pages.
U.S. Office Action dated Jan. 10, 2019 for copending U.S. Appl. No. 15/581,908, 12 pages.
U.S. Office Action dated Jan. 22, 2019 for copending U.S. Appl. No. 15/585,249, 13 pages.
U.S. Office Action dated Feb. 12, 2019 for copending U.S. Appl. No. 15/581,908, 10 pages.
U.S. Office Action dated Apr. 10, 2019 for copending U.S. Appl. No. 15/602,202, 23 pages.
U.S. Office Action dated Apr. 10, 2019 for copending U.S. Appl. No. 15/602,173, 21 pages.
U.S. Office Action dated Apr. 12, 2019 for copending U.S. Appl. No. 15/585,249, 19 pages.
U.S. Office Action dated Apr. 22, 2019 for copending US. Appl. No. 15/498,679, 13 pages.

\* cited by examiner

FIG.2
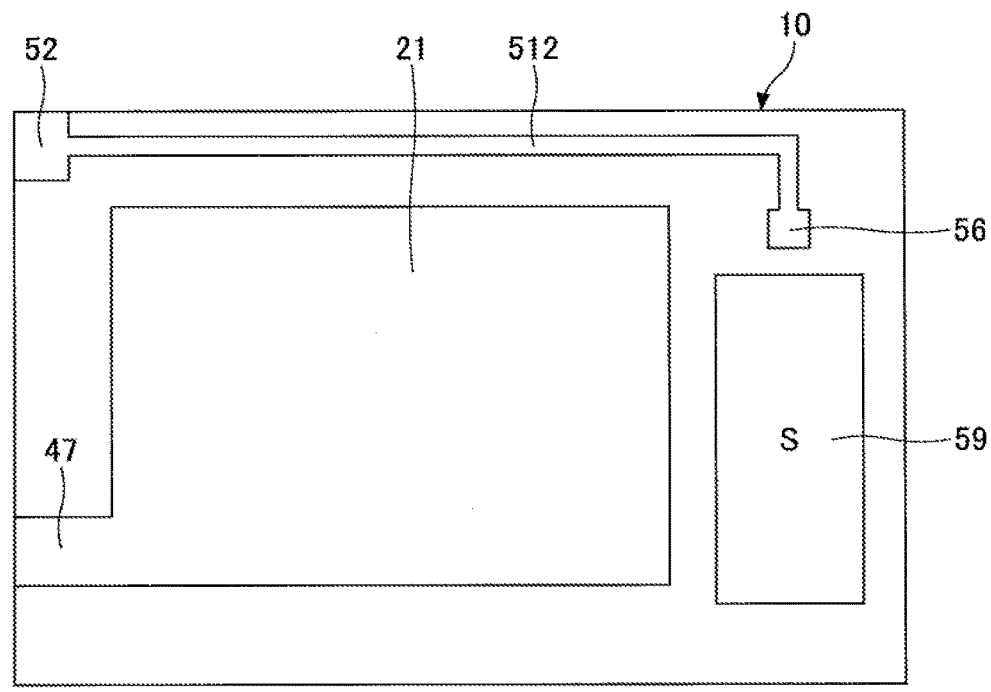
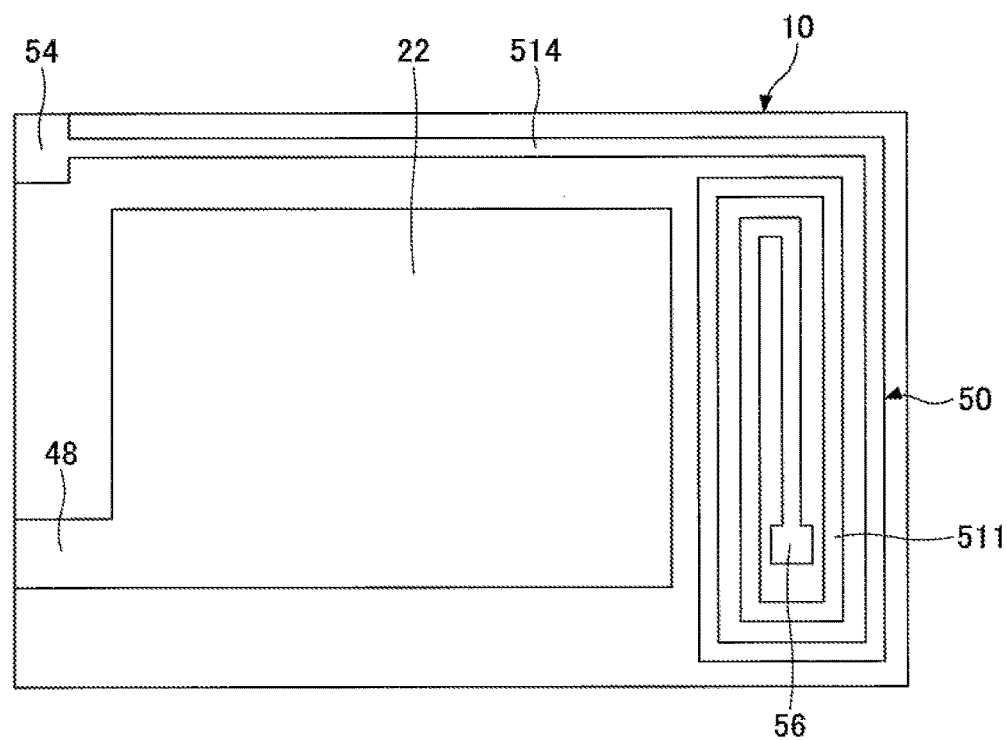

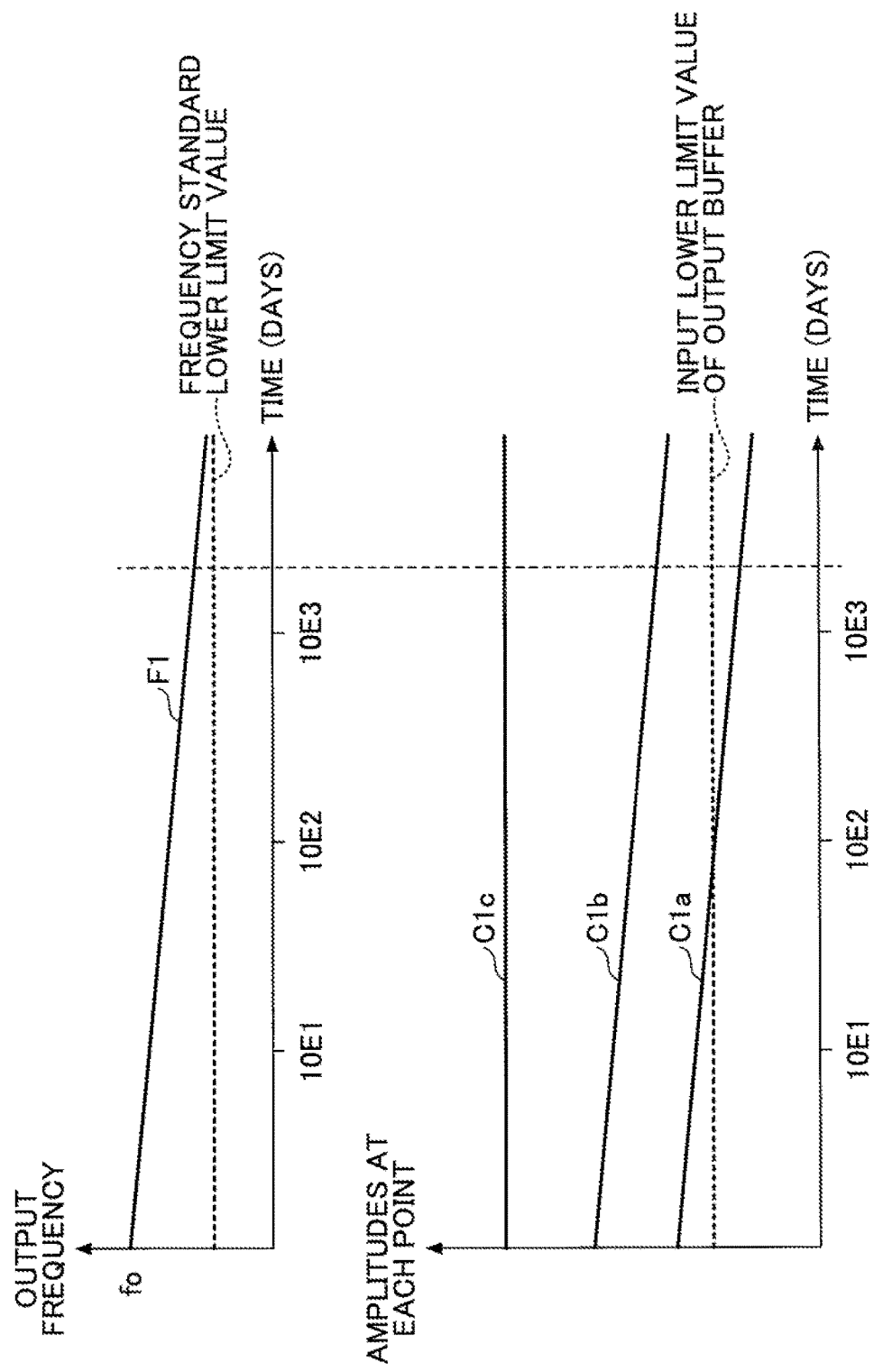

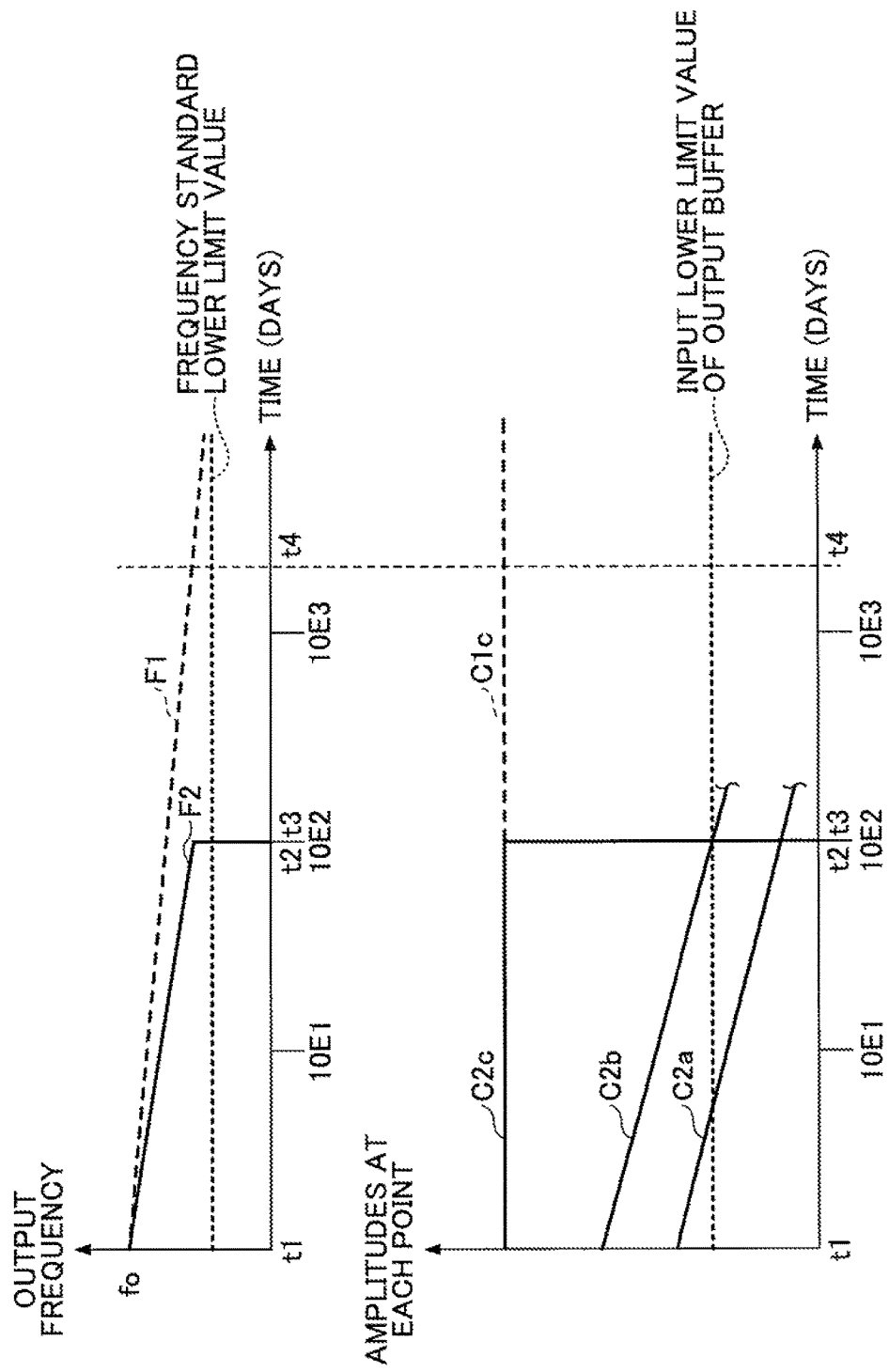

FIG.8A
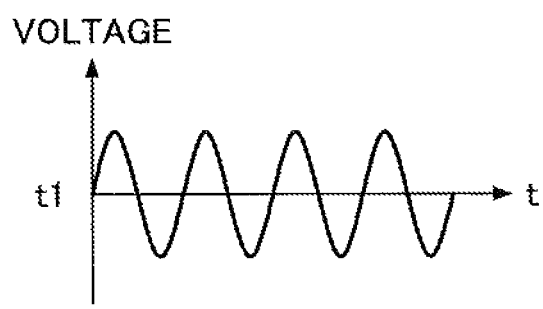
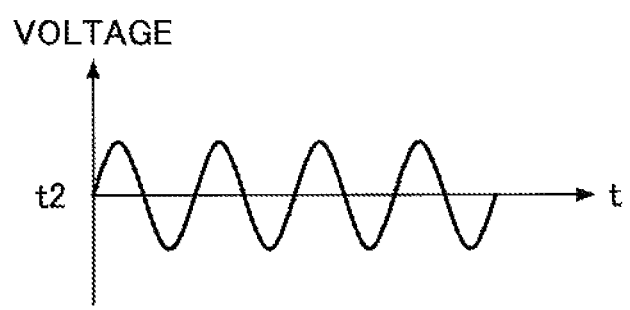
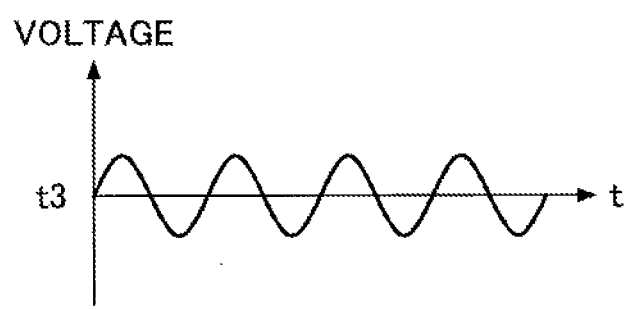

FIG.8C
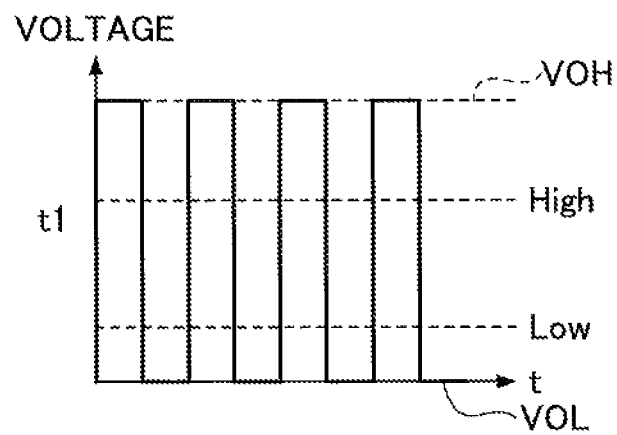
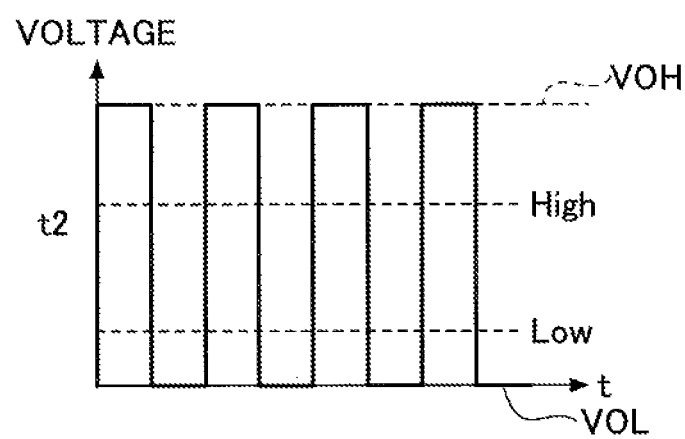
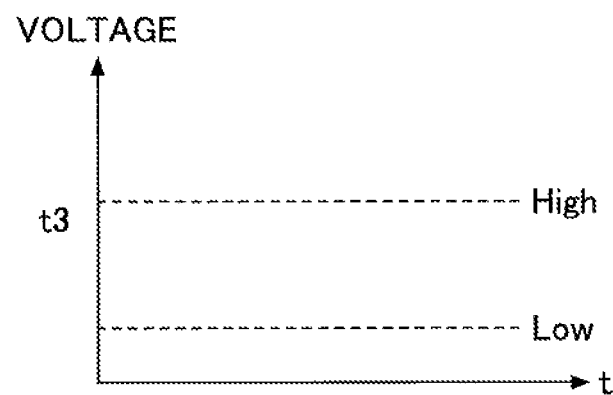

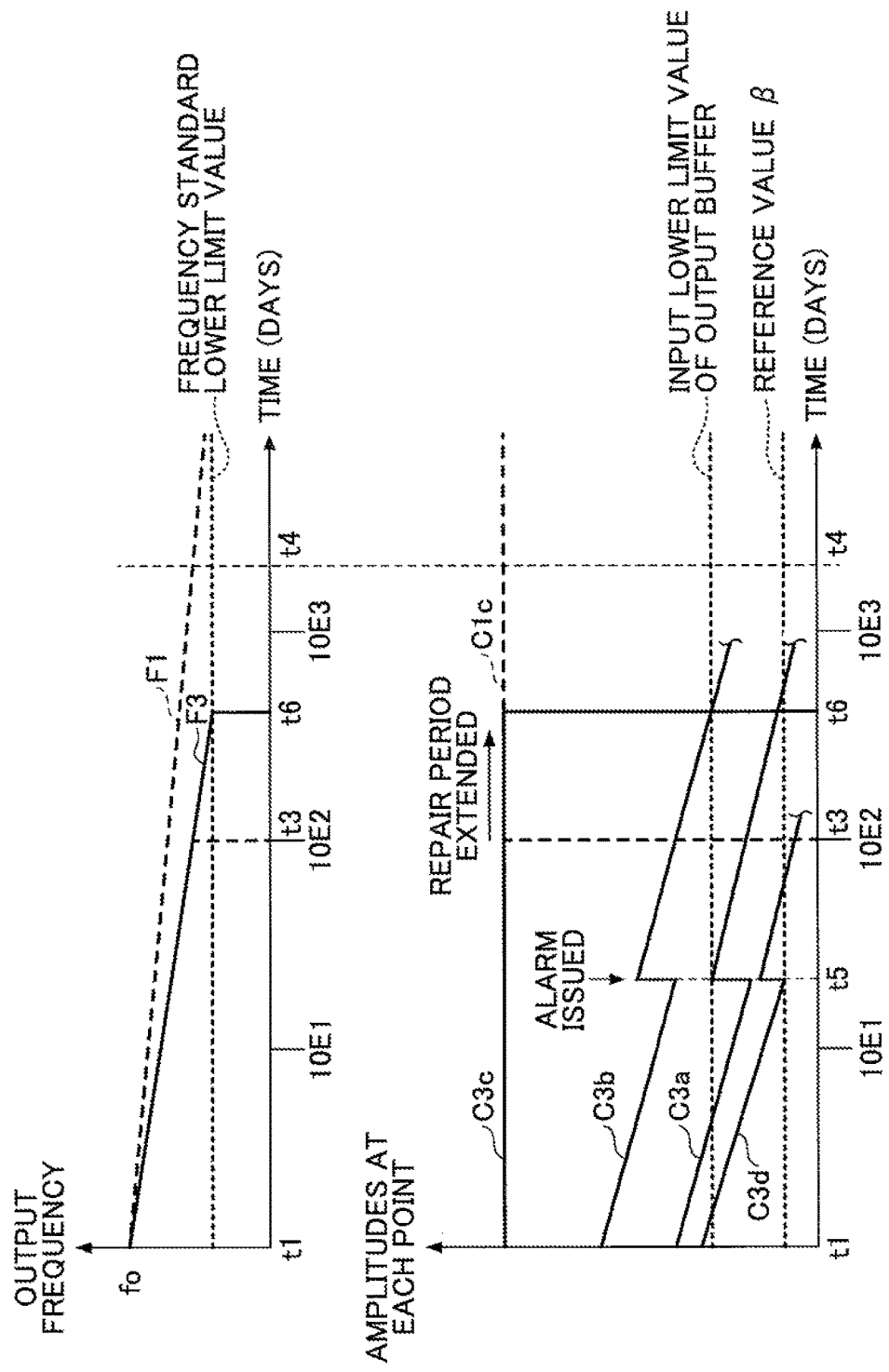

FIG.10
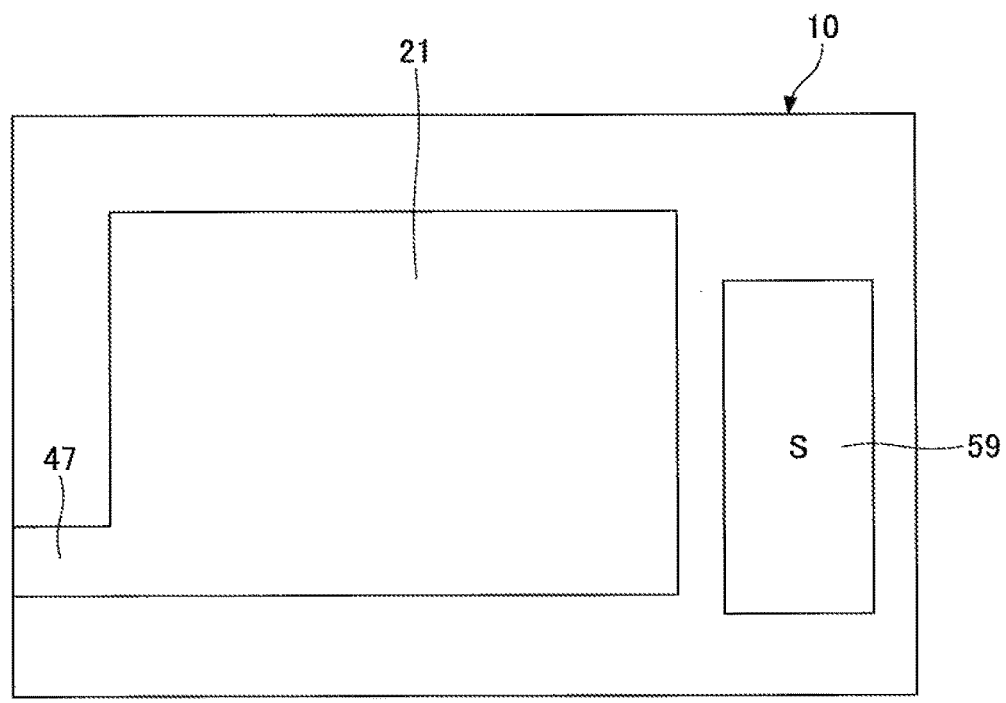
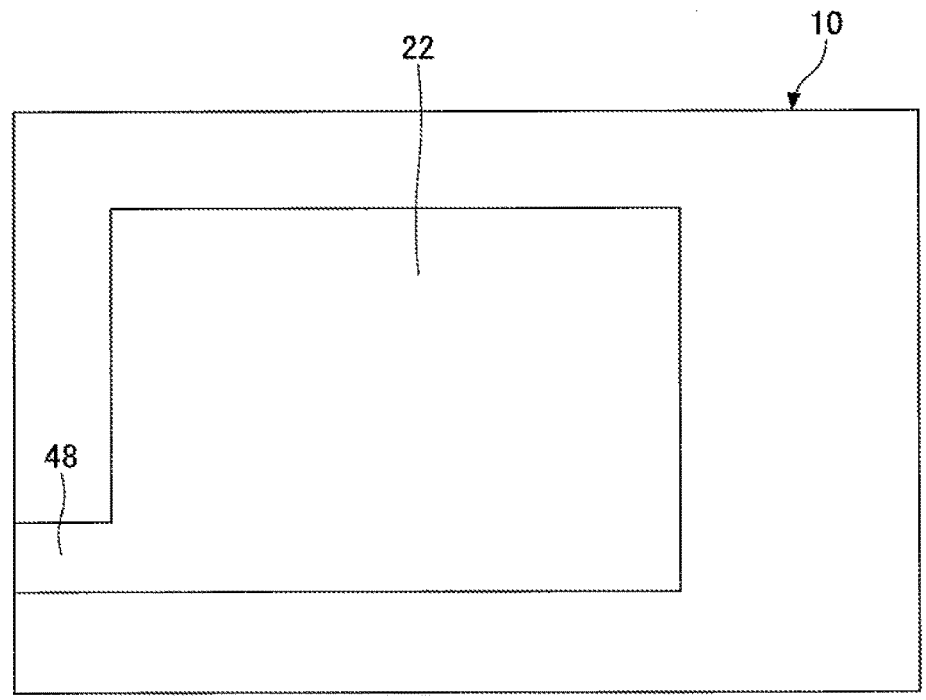

FIG.13
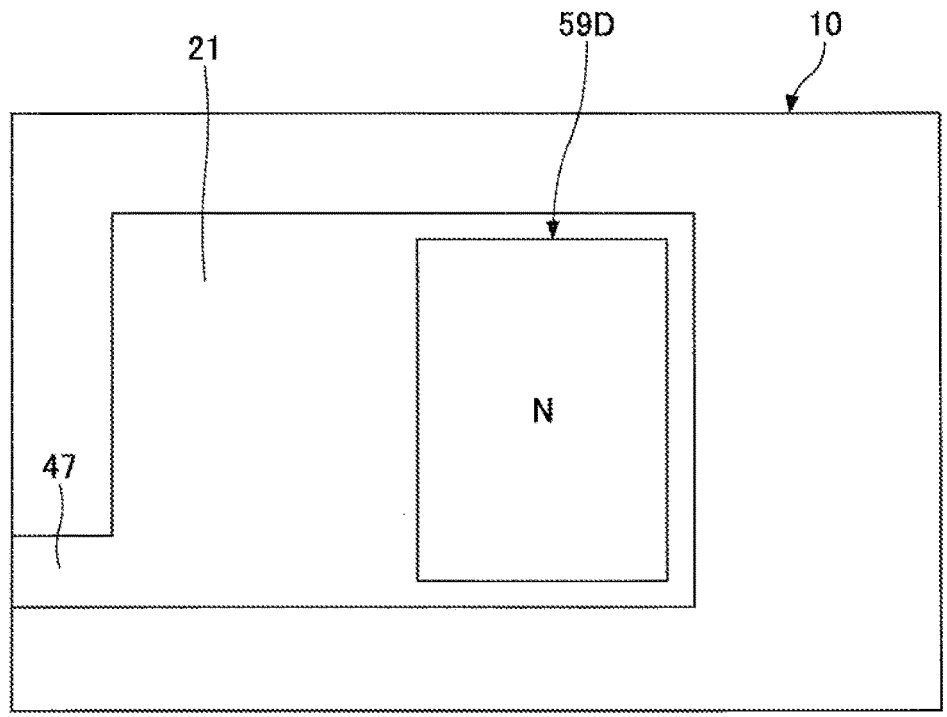
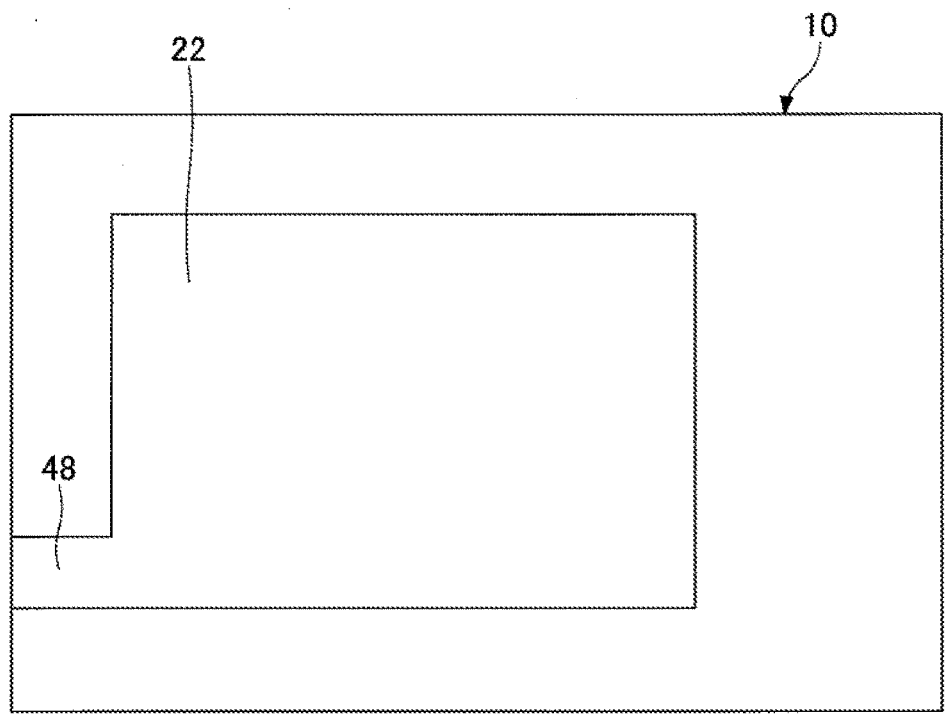

FIG.15
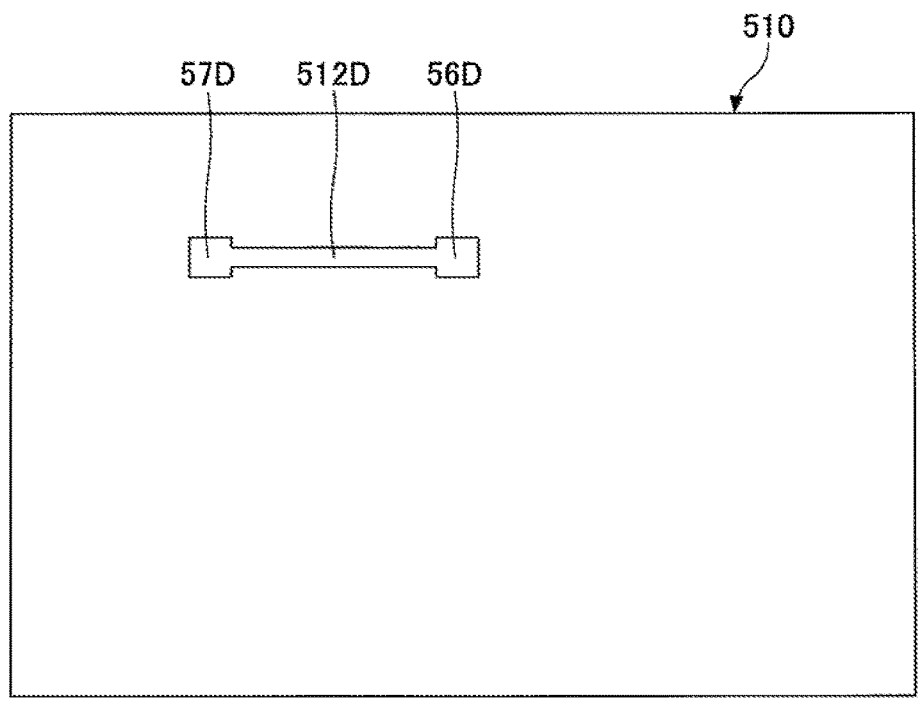
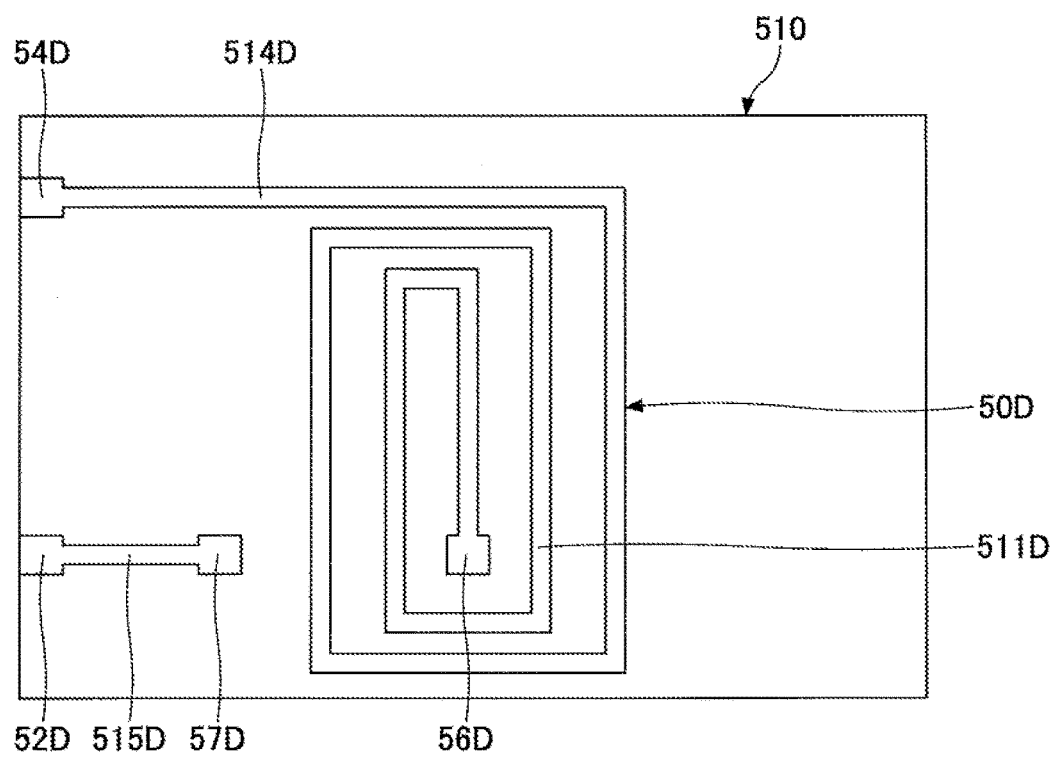

FIG.16
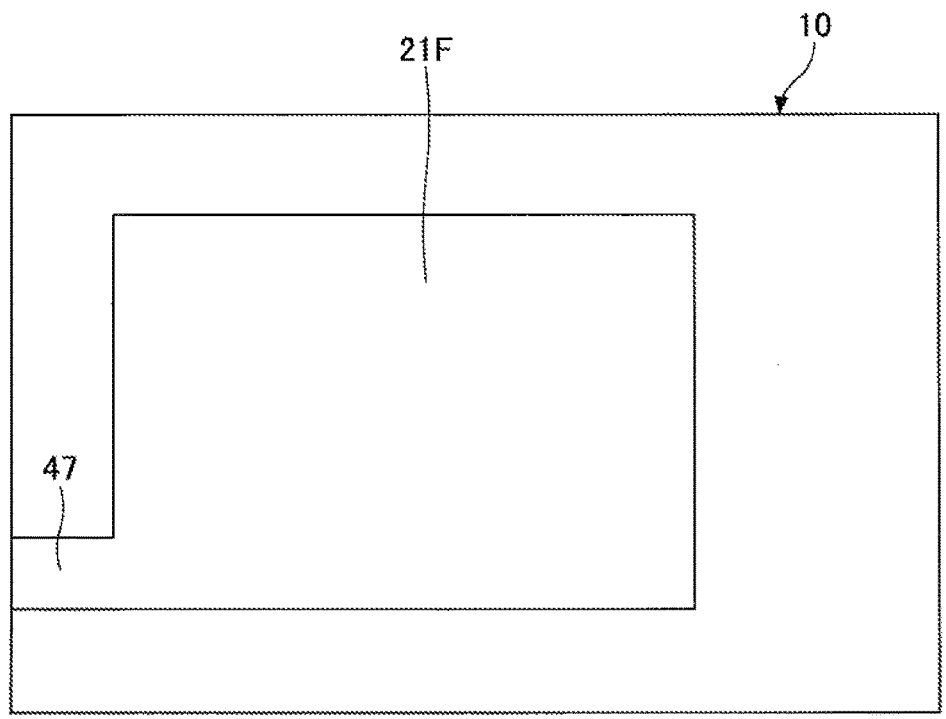
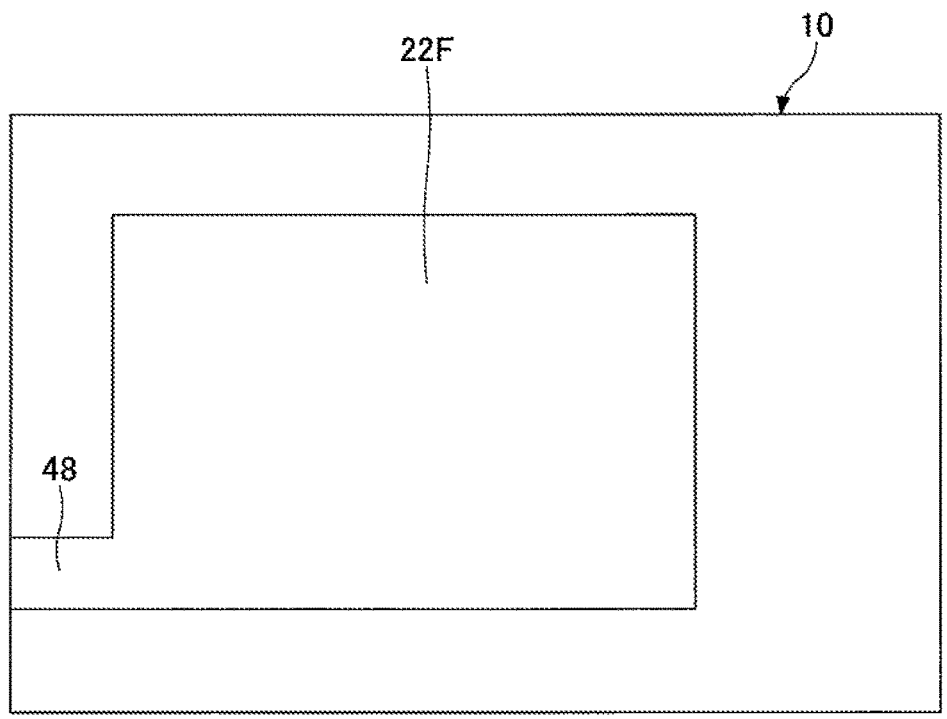

FIG.18
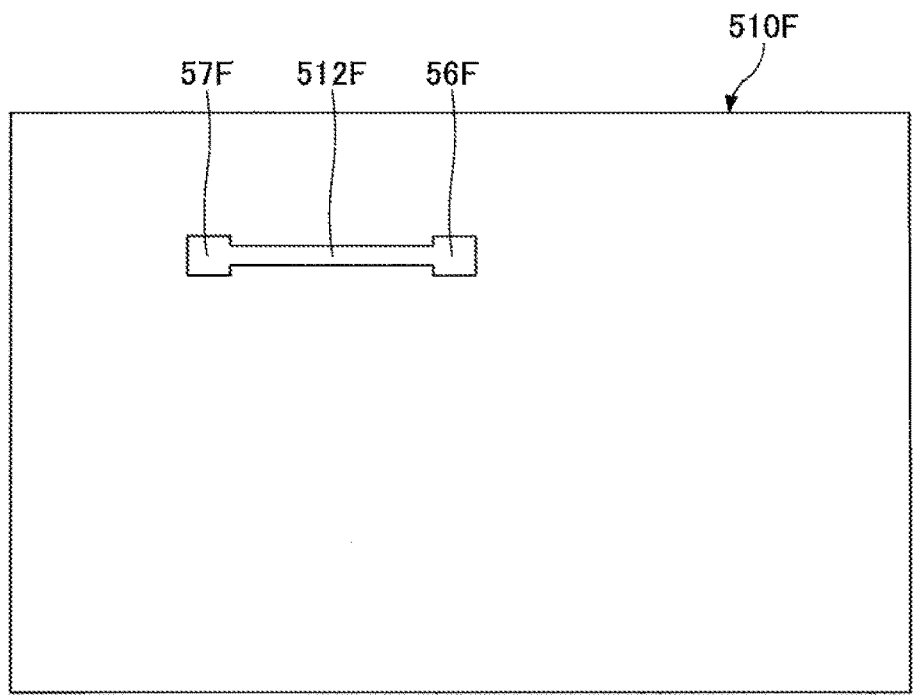
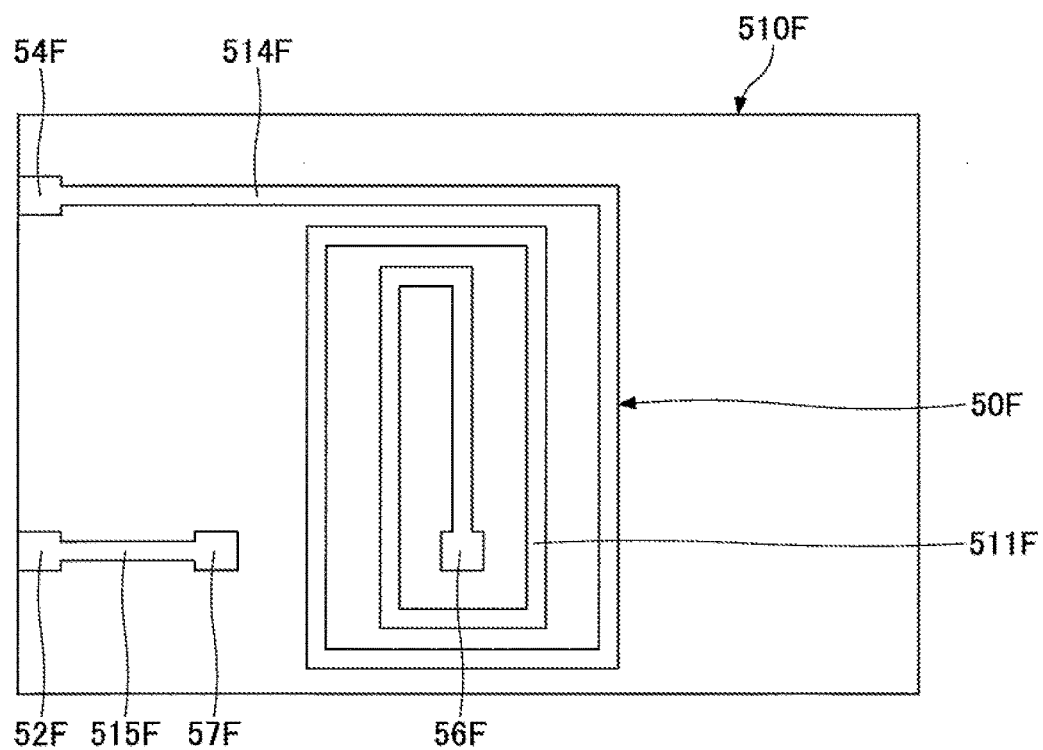

CRYSTAL OSCILLATOR DEVICE AND METHOD OF MEASURING CRYSTAL OSCILLATOR CHARACTERISTIC

CROSS-REFERENCE TO RELATED APPLICATIONS

This present application is based upon and claims the benefit of priority of the prior Japanese Patent Application No. 2016-116462, filed on Jun. 10, 2016, the entire contents of which are incorporated herein by reference.

FIELD

The present disclosure relates to a crystal oscillator device and a method of measuring a characteristic of a crystal oscillator.

BACKGROUND

A technology for detecting a temperature of a dummy substrate based on a signal received by a sensor coil is known in which a dummy substrate having a temperature detecting element connecting a coil or an antenna to a crystal oscillator is placed on a resin sheet on which the sensor coil is disposed.
[Patent Document 1] Japanese Laid-open Patent Publication No. 2008-139256

However, according to the conventional technique as described above, it is difficult to detect a state of the crystal oscillator before a transition to an output stop state (for example, clock stop) based on the signal received by the sensor coil. It is noted that the output stop of the crystal oscillator may occur suddenly due to abnormality of the crystal oscillator or the like.

SUMMARY

According to one aspect of the disclosure, a crystal oscillator device is provided, which includes: a casing; a crystal piece provided in the casing; a pair of excitation electrodes provided on the crystal piece; a magnetic flux generating member provided on the crystal piece; a coil through which magnetic flux from the magnetic flux generating member passes; and an alarm generator configured to generate an alarm based on a signal whose amplitude is equal to or less than a reference value, the signal being generated in the coil.

The object and advantages of the embodiment will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 2 is a diagram explaining an example of coil and magnet implementation.
FIG. 6 is an explanatory diagram of characteristics in a case where the crystal oscillator is a normal product.
FIG. 7 is an explanatory diagram of an output stop event of the crystal oscillator due to abnormality.
FIG. 8A is a diagram illustrating a time-series waveform of a signal appearing at a point A in the case of an abnormal product.
FIG. 8C is a diagram illustrating a time-series waveform of a signal appearing at a point C in the case of an abnormal product.
FIG. 9 is a diagram explaining an example of an operation according to the first embodiment.
FIG. 10 is a top view schematically illustrating magnet implementation according to a second embodiment.
FIG. 13 is a diagram explaining an example of magnet implementation according to a third embodiment.
FIG. 15 is a two-view diagram of a coil substrate.
FIG. 16 is a diagram explaining an example of excitation electrodes according to a fourth embodiment.
FIG. 18 is a two-view diagram of a coil substrate.

DESCRIPTION OF EMBODIMENTS

In the following, embodiments are described in detail with reference to appended drawings.

First Embodiment

Figure 1A:
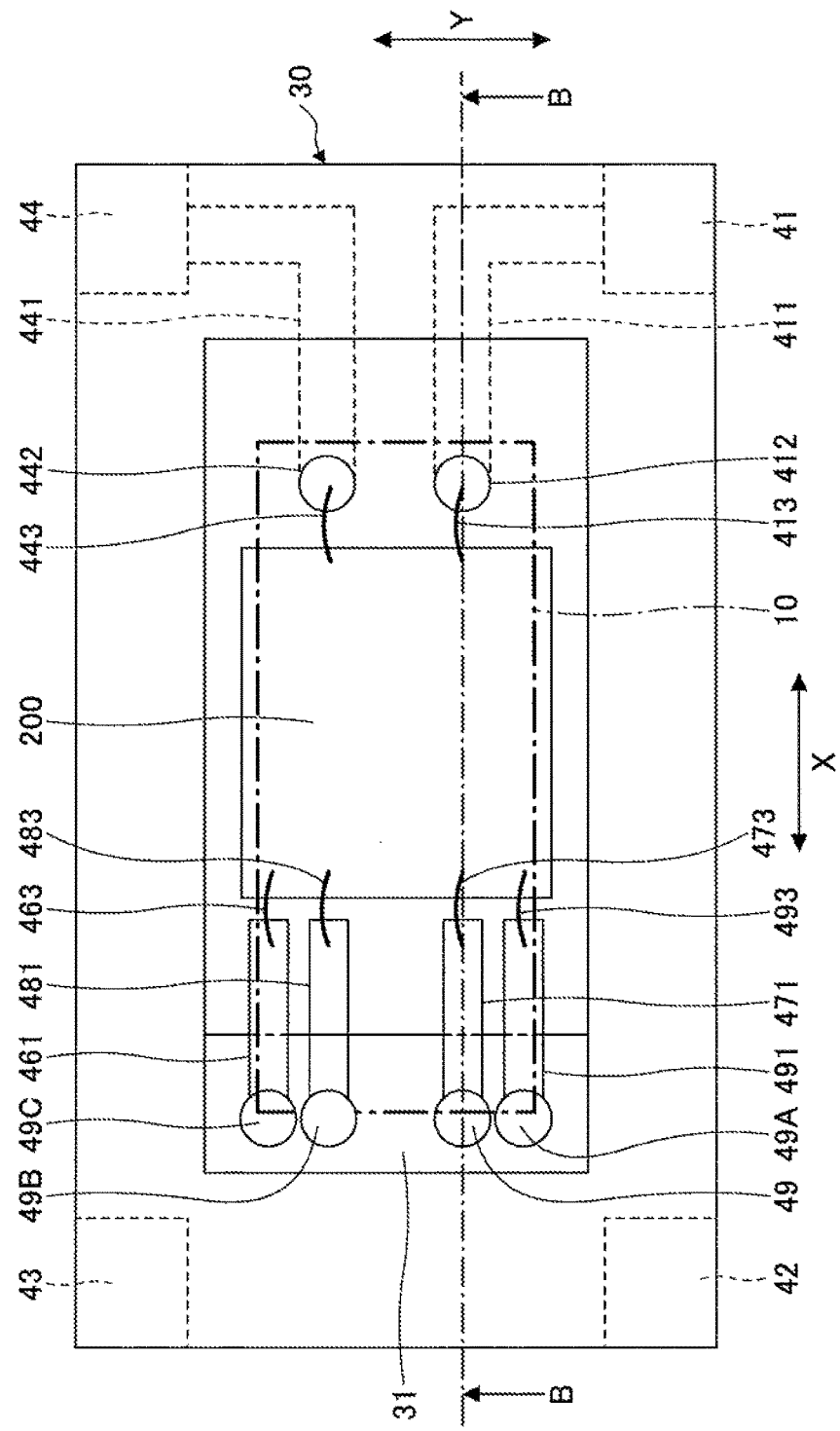
FIG. 1A is a top view schematically illustrating a configuration of a crystal oscillator according to a first embodiment.
Figure 1B:
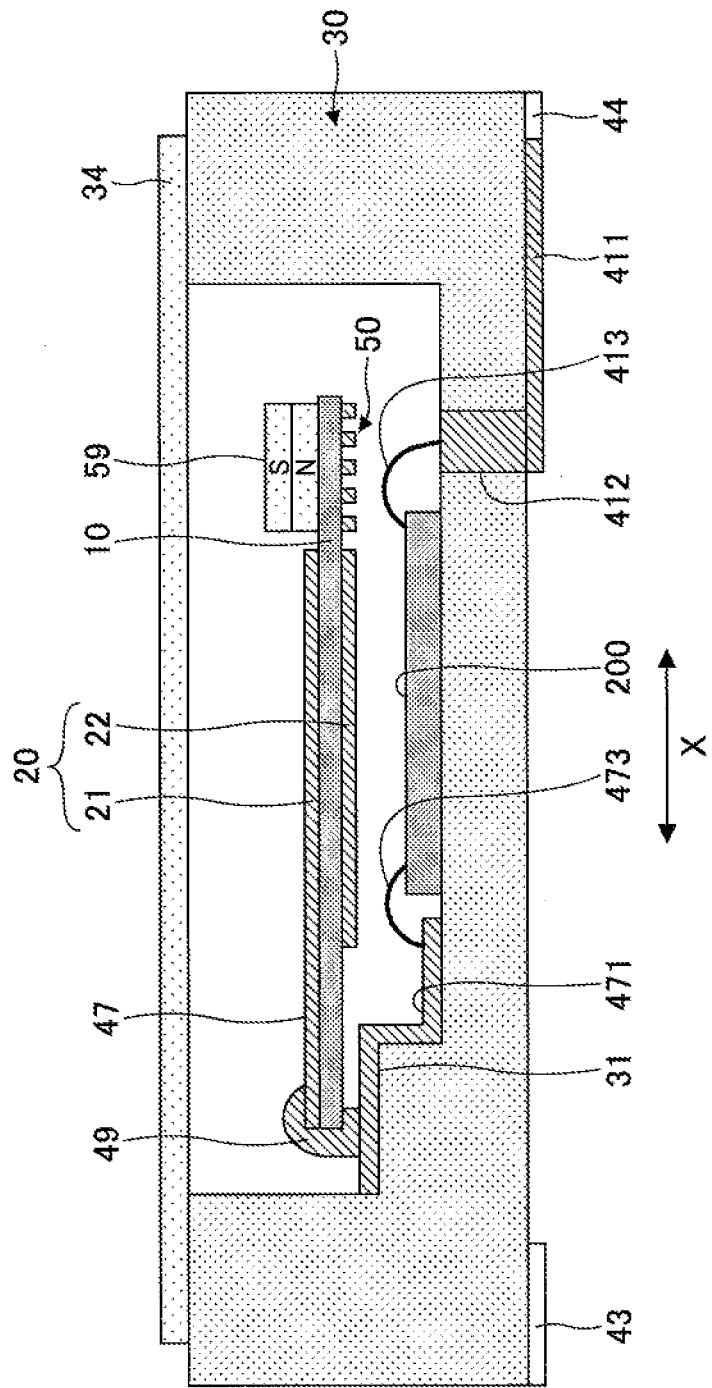
FIG. 1B is a cross-sectional view along a line B-B in FIG. 1A.

FIG. 1A is a top view schematically illustrating a configuration of a crystal oscillator 100 according to a first embodiment, and FIG. 1B is a cross-sectional view along a line B-B in FIG. 1A. FIG. 2 is a diagram explaining an example of implementation of a coil 50 and a magnet 59, and a two-side view (plan views illustrating an upper surface and a lower surface) of a crystal piece 10. In FIG. 1A, a lid of a casing 30 is not illustrated so that an inside can be seen, and invisible elements (an external electrode 41, etc.) are indicated by broken lines. In addition, in FIG. 1A, only an outline of the crystal piece 10 is indicated by an alternate long and short dash line (the coil 50, the magnet 59, etc., are not illustrated). It is noted that FIGS. 1A and 1B illustrate an IC 200 in addition to the crystal oscillator 100. Further, in FIGS. 1B and 2, a polarity (N pole, S pole) of the magnet 59 is schematically illustrated as "N" and "S".

Hereinafter, a thickness direction of the crystal piece (crystal blank) 10 (vertical direction in FIG. 1B) is defined as the vertical direction, and the side of the casing 30 having the lid is referred to as "upper side". However, an orientation of the installation of the crystal oscillator 100 is arbitrary. In the following, an "outer surface" refers to a surface exposed to an outside of the casing 30, and an "inner surface" refers to a surface exposed to an inner space of the casing 30. Further, as illustrated in FIG. 1A, an X direction is defined as a direction corresponding to a direction of a main vibration (thickness shear vibration) direction of the crystal oscillator 100.

The crystal oscillator 100 includes a crystal piece 10, excitation electrodes 20, a casing 30, external electrodes 41 to 44, a coil 50, and a magnet 59 (an example of a magnetic flux generating member). As illustrated in FIGS. 1A and 1B, the crystal oscillator 100 is of a surface mounting type.

The crystal piece 10 may be, for example, an AT-cut artificial quartz crystal substrate. An outer shape of the crystal piece 10 is arbitrary, and in the first embodiment, it is a rectangle, but other shapes may be used. Although the supporting structure of the crystal piece 10 is arbitrary. For example, the crystal piece 10 may be supported by the casing 30 in a cantilever structure. In the example illustrated in FIGS. 1A and 1B, the crystal piece 10 is supported in a cantilever structure on a bank portion 31 of the casing 30. When the crystal oscillator 100 is driven, the crystal piece 10 vibrates in the X direction (thickness shear vibration).

The excitation electrodes 20 excite the crystal piece 10. The excitation electrodes 20 include an upper excitation electrode 21 provided on the upper surface of the crystal piece 10 and a lower excitation electrode 22 provided on the lower surface of the crystal piece 10. The excitation electrodes 20 excite the crystal piece 10 by a potential difference between the upper excitation electrode 21 and the lower excitation electrode 22. It is noted that the excitation electrodes 20 may be made of gold, silver, aluminum, or the like.

The excitation electrodes 20 are electrically connected to an IC (Integrated Circuit) 200. The way of electrically connecting the excitation electrodes 20 and the IC 200 is arbitrary. In the example illustrated in FIGS. 1A and 2, the upper excitation electrode 21 is electrically connected to the IC 200 via a conductive pattern 47 (see FIG. 2) formed on an upper surface of the crystal piece 10, an electrically conductive adhesive 49, a conductive pattern 471 formed on an inner surface of a lower part of the casing 30, and a wire 473. Further, the lower excitation electrode 22 is electrically connected to the IC 200 via a conductive pattern 48 (see FIG. 2) formed on a lower surface of the crystal piece 10, an electrically conductive adhesive 49B, a conductive pattern 481 formed on an inner surface of a lower part of the casing 30, and a wire 483. It is noted that the wires 473 and 483 (the same applies to a wire 493, etc., described hereinafter) may be formed by wire bonding. It is noted that the electrically conductive adhesives 49, 49B (as well as conductive adhesives 49A, 49C described hereinafter) may be provided at an edge portion of the crystal piece 10 (i.e., the edge on the cantilevered side).

The casing 30 accommodates the crystal piece 10. The casing 30 is made of, for example, a ceramic material. In this case, the casing 30 may be, for example, a ceramic package formed by laminating ceramic material layers. The casing 30 includes a lid 34 (see FIG. 1B and the like), and hermetically encloses the crystal piece 10 in an internal space (cavity) thereof. For example, the internal space of the casing 30 under vacuum or filled with dry nitrogen and sealed with the lid 34. It is noted that the lid 34 may be a metal plate or a ceramic plate.

The external electrodes 41 to 44 are provided on the casing 30. In the example illustrated in FIGS. 1A and 1B, the external electrodes 41 to 44 are provided on an outer surface of the lower portion of the casing 30. The external electrodes 41 to 44 may be electrically connected to the IC 200. The way of electrically connecting the external electrodes 41 to 44 and the IC 200 is arbitrary. In the example illustrated in FIGS. 1A and 1B, the external electrode 41 is electrically connected to the IC 200 via a conductive pattern 411 formed on the outer surface of the lower portion of the casing 30, a via 412 formed in the casing 30, and a wire 413. Similarly, the external electrode 44 is electrically connected to the IC 200 via a conductive pattern 441 formed on the outer surface of the lower portion of the casing 30, a via 442 formed in the casing 30, and a wire 443. Although not illustrated, the external electrodes 42, 43 and the IC 200 may also be electrically connected via a conductive pattern or the like in the same manner.

The external electrodes 41 to 44 may be electrically connected to an external device or the like outside of the casing 30. That is, the external electrodes 41 to 44 are electrically connected to the IC 200 and the external device to electrically connect the IC 200 to the external device or the like. In the example illustrated in FIGS. 1A and 1B, the external electrodes 41 and 44 may be used to extract signals from an alarm output terminal 222 and a clock output terminal 220 (see FIG. 4) of the IC 200. Further, in the example illustrated in FIGS. 1A and 1B, the external electrodes 42, 43 may be used for electrically connecting the IC 200 to ground and a power supply (both not illustrated) (wirings are not illustrated).

The coil 50 and the magnet 59 are provided in the crystal oscillator 100 such that the density of the magnetic flux passing through the coil 50 and generated from the magnet 59 changes in accordance with the oscillation of the crystal oscillator 100. The coil 50 is electrically connected to the IC 200. The way of electrically connecting the coil 50 and the IC 200 is arbitrary. The electrical connection between the coil 50 and the IC 200 may be implemented by, for example, wire bonding or the like.

In the example illustrated in FIGS. 1A and 2, the coil 50 includes a coil pattern portion 511, wiring portions 512 and 514, and a through hole 56. The coil pattern portion 511 is formed on the lower surface of the crystal piece 10. The coil pattern portion 511 is spirally formed from the through hole 56 in a plurality of turns in a plan view (a view in a direction perpendicular to the surface of the crystal piece 10). The coil pattern portion 511 is formed at a position where the coil pattern portion 511 is opposed to the magnet 59 in the vertical direction. One end (the center side of the turns) of the coil pattern portion 511 is drawn out to the upper surface of the crystal piece 10 via the through hole 56 and is electrically connected to the electrode 52 via the wiring portion 512. It is noted that the through hole 56 can be formed by etching the crystal piece 10. The other end of the coil pattern portion 511 is electrically connected to the electrode 54 via the wiring portion 514. The wiring portions 512 and 514 are formed on the upper surface and the lower surface of the crystal piece 10, respectively. As illustrated in FIG. 1A, the electrode 52 is electrically connected to the IC 200 via an electrically conductive adhesive 49C, a conductive pattern 461 formed on the inner surface of the lower portion of the casing 30, and a wire 463. Accordingly, one end of the coil 50 is electrically connected to the IC 200 via the electrode 52, the conductive adhesive 49C, the conductive pattern 461, and the wire 463. As illustrated in FIG. 1A, the electrode 54 is electrically connected to the IC 200 via an electrically conductive adhesive 49A, a conductive pattern 491 formed on the inner surface of the lower portion of the casing 30, and a wire 493. Accordingly, the other end of the coil 50 is electrically connected to the IC 200 via the electrode 54, the conductive adhesive 49A, the conductive pattern 491, and the wire 493.

Further, in the example illustrated in FIGS. 1A and 2, the magnet 59 is placed on the upper surface of the quartz piece 10. The magnet 59 is provided in a region overlapping with the coil 50 in a plan view (a view in a direction perpendicular to the surface of the crystal piece 10). The magnet 59 may be provided at a position where the density of the magnetic flux passing through the coil 50 is maximum in the neutral state (for example, in a state of not oscillating) of the crystal piece 10.

It is noted that, in the example illustrated in FIGS. 1A and 2, the coil 50 is formed on the lower surface of the crystal piece 10; however, the coil 50 may be formed on the upper surface of the crystal piece 10. In this case, the magnet 59 is provided on the lower surface of the crystal piece 10. Further, in the examples illustrated in FIGS. 1A and 2, the coil pattern portion 511 is formed in a plurality of turns in order to increase the number of windings, but may be wound once. It is noted that either of the N pole and the S pole in the magnet 59 may be on the upper side.

Figure 3A:
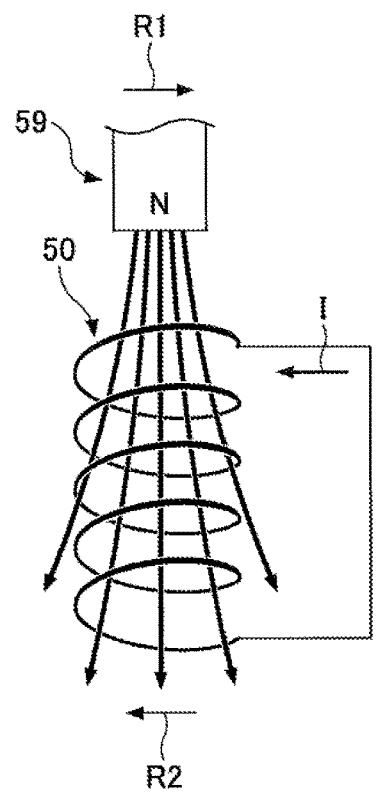
FIG. 3A is an explanatory diagram of a principle in which a current flows in a coil due to oscillation of a crystal oscillator device.
Figure 3B:
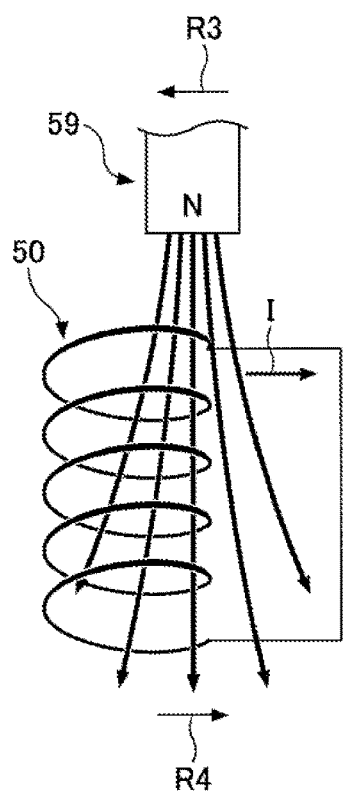
FIG. 3B is an explanatory diagram of a principle in which a current flows in a coil due to oscillation of a crystal oscillator device.

When the crystal oscillator 100 is in the oscillation state, the crystal piece 10 is subjected to thickness shear vibration (also referred to as "main vibration"), and the density of the magnetic flux passing through the coil 50 changes according to the oscillation of the crystal piece 10. Therefore, due to electromagnetic induction, a voltage waveform oscillating at a cycle corresponding to an output frequency of the crystal oscillator 100 is generated between the opposite ends of the coil 50. Specifically, during the thickness shear vibration, the magnet 59 and the coil 50 are displaced in the opposite direction from the center position of the thickness shear vibration of the crystal oscillator 100 illustrated in FIG. 3A (see arrows R1, R2). At this time, since a density of the magnetic flux passing through the coil 50 decreases, the current I flows in the coil 50 in a direction to increase the density of the magnetic flux passing through the coil 50 by electromagnetic induction. On the other hand, the magnet 59 and the coil 50 are displaced in the opposite direction (see arrows R3, R4) from the maximum displacement position of the thickness shear vibration of the crystal oscillator 100 illustrated in FIG. 3B. At this time, since the density of the magnetic flux passing through the coil 50 increases, a current I (current in the direction opposite to that in FIG. 3A) flows in the coil 50 in a direction in which the density of the magnetic flux passing through the coil 50 decreases due to electromagnetic induction. In this way, the voltage waveform oscillating at the cycle corresponding to the output frequency of the crystal oscillator 100 is generated between the opposite ends of the coil 50. The frequency and the amplitude of the voltage waveform generated across the coil 50 decreases as the oscillation level of the crystal oscillator 100 decreases (described hereinafter with reference to FIG. 8D). This is because, with respect to the amplitude, the amount of change in the density of the magnetic flux passing through the coil 50 decreases as the oscillation level of the crystal oscillator 100 decreases.

As described above, the IC 200 is electrically connected to the excitation electrodes 20 and the coil 50 of the crystal oscillator 100. The IC 200 forms an example of a crystal oscillator device together with the crystal oscillator 100. In the example illustrated in FIGS. 1A and 1B, the IC 200 is provided on an inner surface of the lower portion of the casing 30. That is, the IC 200 is provided in the internal space of the casing 30. However, in the modified example, the IC 200 may be provided outside the casing 30. In this case, for example, the excitation electrodes 20, the coil 50, and the magnet 59 may be electrically connected to the external electrodes 41 to 44, respectively, and the IC 200 may be electrically connected to the external electrodes 41 to 44.

It is noted that, in the examples illustrated in FIGS. 1A and 1B, the IC 200 may be provided with bumps (terminals) on the bottom surface thereof. In this case, the IC 200 may be electrically connected to the via 412 or the like via the bumps instead of the wire 413 or the like.

Figure 4:
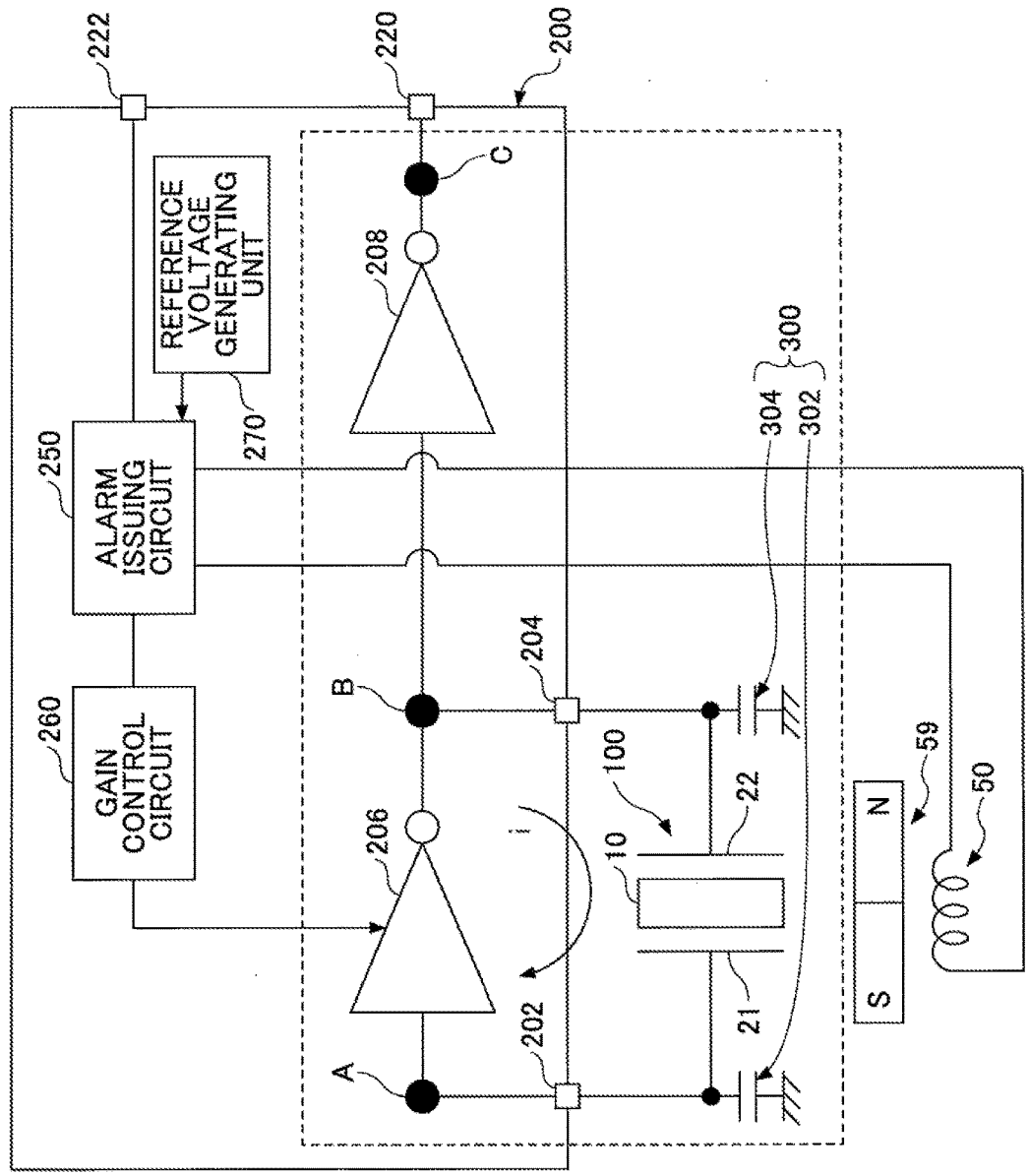
FIG. 4 is a diagram schematically illustrating an example of a circuit configuration of a crystal oscillator device including a crystal oscillator and an IC.

FIG. 4 is a diagram schematically illustrating an example of a circuit configuration of the crystal oscillator 100 and the IC 200. In FIG. 4, with respect to IC 200, capacitors of terminals, stray capacitance of wiring patterns of the printed circuit board, resistance for limiting the current (see arrow i in FIG. 4) flowing through the crystal oscillator 100, etc., are not illustrated.

In the example illustrated in FIG. 4, the upper excitation electrode 21 and the lower excitation electrode 22 of the crystal oscillator 100 are electrically connected to an input terminal 202 and an output terminal 204 of the IC 200, respectively. However, the lower excitation electrode 22 and the upper excitation electrode 21 of the crystal oscillator 100 may be connected to the input terminal 202 and the output terminal 204 of the IC 200, respectively. The crystal oscillator 100 cooperates with the IC 200 to generate a clock (reference clock) used in an arbitrary device (for example, a communication control device such as a base station device or a relay station device).

A matching capacitor 300 is electrically connected to the crystal oscillator 100. Specifically, a first capacitor 302 is electrically connected between the upper excitation electrode 21 of the crystal oscillator 100 and ground, and a second capacitor 304 is electrically connected between the lower excitation electrode 22 of the crystal oscillator 100 and ground. The matching capacitor 300 is provided for adjustment (matching adjustment) so that the output frequency (initial value) of the crystal oscillator 100 becomes a desired value (designed value) when the total capacitance (load capacitance value) in the overall circuit of the IC 200 including the crystal oscillator 100 is added. It is noted that, in FIG. 4, an area surrounded by a dotted line forms an oscillation circuit.

The IC 200 includes an inverting amplifier 206, an output buffer (buffer circuit) 208, an alarm issuing circuit 250 (an example of an alarm generator), a gain control circuit 260 (an example of a gain control unit), and a reference voltage generating unit 270.

As described above, the inverting amplifier 206 inverts and amplifies the output of the crystal oscillator 100 (the signal input from the upper excitation electrode 21 to the input terminal 202). That is, the signal input from the upper excitation electrode 21 to the input terminal 202 is inverted and amplified by the inverting amplifier 206. The inverted and amplified signal is input to the output buffer 208 and input to the lower excitation electrode 22 via the output terminal 204.

The gain (gain) of the inverting amplifier 206 is variable. It is noted that the inverting amplifier 206 may be of a type that is used for AGC (Automatic Gain Control) (for example, a type that uses a variable resistor or a field effect transistor as a variable resistance element). However, in the first embodiment, control for adjusting the gain of the inverting amplifier 206 (i.e., the automatic gain control) to always keep the output constant is not performed, as described hereinafter. That is, no automatic gain control circuit is provided. As a result, since a circuit configuration for automatic gain control becomes unnecessary, a simple configuration can be realized, and power saving can be achieved.

Figure 5:
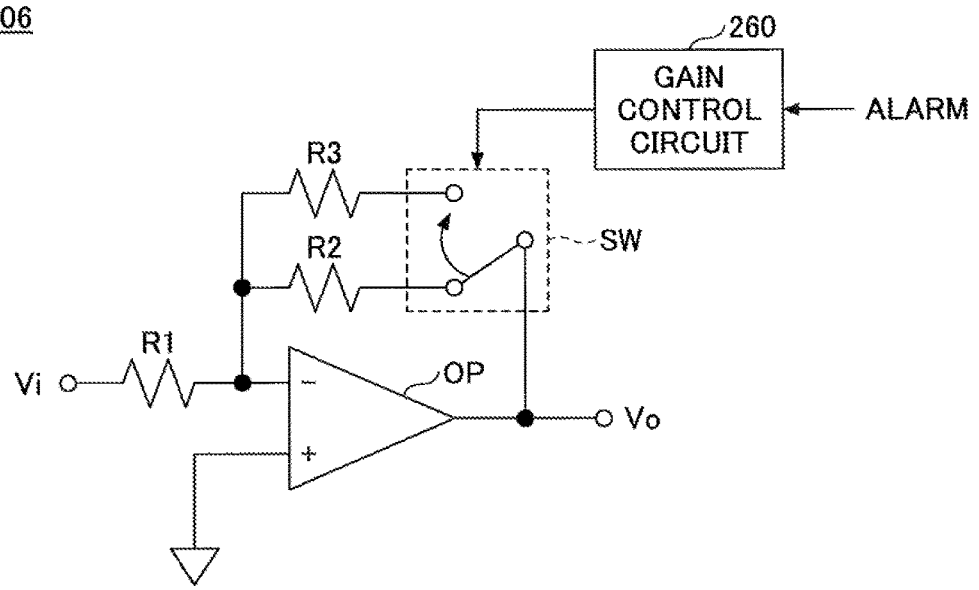
FIG. 5 is a diagram for illustrating an example of an inverting amplifier.

In the first embodiment, as an example, as illustrated in FIG. 5, the inverting amplifier 206 includes an operational amplifier OP, a resistor R2 (an example of a first resistor), and a resistor R3 (an example of a second resistor). The resistors R2 and R3 are provided in parallel on a line which is provided for returning the output of the operational amplifier OP to the inverting terminal. The inverting amplifier 206 further includes a switch SW. The switch SW has a first state in which an inverting terminal of the operational amplifier OP is electrically connected to an output terminal of the operational amplifier OP via the resistor R2, and a second state in which the inverting terminal of the operational amplifier OP is electrically connected to the output terminal of the operational amplifier OP via the resistor R3. The state of the switch SW is controlled by the gain control circuit 260. In the first state, the relationship between the input voltage Vi and the output voltage Vo is Vo=R2/R1×Vi, and R2/R1 is the amplification factor. In the second state, the relationship between the input voltage Vi and the output voltage Vo is Vo=R3/R1×Vi, and R3/R1 is the amplification factor. For example, if R3>R2, since R3/R1>R2/R1, the amplification factor (that is, the gain of the inverting amplifier 206) becomes higher in the second state than in the first state. According to the example illustrated in FIG. 5, it is possible to realize the inverting amplifier 206 whose gain is variable with a simple configuration, as compared with the inverting amplifier of the type using a variable resistor or the like.

The output buffer 208 may be formed by a CMOS (Complementary Metal Oxide Semiconductor), for example. The output buffer 208 generates a signal (pulse signal) representing the oscillation state of the crystal oscillator 100 based on the input signal (the signal inverted and amplified by the inverting amplifier 206). The output buffer 208 outputs "voltage VOH" when the level of the input signal (hereinafter also referred to as "input level") exceeds a first threshold value and outputs "voltage VOL" when the input level becomes lower than a second threshold value. It is noted that the first threshold value and the second threshold value may be set to the same or may be set differently, depending on a voltage value (threshold level) at which a P-type MOS and a N-type MOS, which form the CMOS of the output buffer 208, are turned on/off. In this way, in the example illustrated in FIG. 4, the output of the crystal oscillator 100 is not directly output from the crystal oscillator 100 but is output to the clock output terminal 220 via the output buffer 208.

The alarm issuing circuit 250 has a function (hereinafter referred to as "pre-output stop state detection function") for detecting a state (hereinafter referred to as "pre-output stop state") before the crystal oscillator 100 stops outputting. It is noted that, the fact that the crystal oscillator 100 stops outputting means that the oscillation circuit stops outputting. The fact that the crystal oscillator 100 stops outputting means the transition to the state in which the output from the output buffer 208 does not change (i.e., the state in which a normal output, which alters between "VOH" and "VOL" at the cycle corresponding to the output frequency of the crystal oscillator 100, cannot be obtained.

The alarm issuing circuit 250 is electrically connected to the coil 50. The alarm issuing circuit 250 realizes the pre-output stop state detection function by monitoring the signal appearing in the coil 50. The alarm issuing circuit 250 generates an alarm when the amplitude of the signal appearing in the coil 50 (the amplitude of the voltage waveform generated across the coil 50) becomes equal to or less than a predetermined reference value R. The amplitude of the signal may be based on the difference between the maximum value and the average value of the level of the signal for the most recent predetermined period, the difference between the average value and the minimum value of the level of the signal for the latest predetermined period, half of the difference between the maximum value and the minimum value of the level of the signal for the latest predetermined period, etc. It is noted that the alarm issuing circuit 250 may use the maximum value of the level of the signal for the latest predetermined period as the amplitude. This is because, for example, the maximum value of the signal level of the most recent one cycle is correlated with the amplitude of the same signal in the same cycle. Alternatively, the alarm issuing circuit 250 may use integrated value of the amplitude values of the signal over the latest predetermined period as the amplitude.

The reference value β is set to a value greater than the amplitude Cm of the signal appearing in the coil 50 when the amplitude of the input to the output buffer 208 becomes an input lower limit value. For example, the reference value β may be β=1.1×Cm or β>1.1×Cm. The input lower limit value of the output buffer 208 corresponds to the lower limit value of the input level (magnitude of the input voltage) to the output buffer 208 when the output is obtained from the output buffer 208. That is, even if the input to the output buffer 208 alters periodically, a significant output from the output buffer 208 (an output that can function as a clock source) cannot be obtained in a state in which the level of the input to the output buffer 208 is below a certain lower limit value and thus the CMOS is not turned on/off. The input lower limit value of the output buffer 208 corresponds to the lower limit value. It is noted that the reference value β may be uniformly set based on a design value of the input lower limit value of the output buffer 208. Alternatively, the reference value β may be set for each individual based on measured values for individuals, corresponding to input lower limit values or the like which may differ for each individual of the output buffer 208. In this case, for example, the reference value β may be set based on an actually measured value at the time of shipment of a product including the crystal oscillator 100 and the IC 200 (for example, an actually measured value of the amplitude Cm).

The alarm generated by the alarm issuing circuit 250 is output to the outside via the alarm output terminal 222 and input to the gain control circuit 260. It is noted that the alarm output via the alarm output terminal 222 may be transmitted to, for example, an external user device (not illustrated). When the output of the crystal oscillator 100 functions as a clock of the communication control device, the user device may be, for example, a central management server that manages a base station or the like. In this case, the alarm may be a signal causing an alarm output including a voice or a display, or may include information of an index value (for example, the current value of the amplitude of the signal appearing in the coil 50) representing the lowered state of the current oscillation level. Upon receipt of such an alarm output, for example, a user who is a telecommunications carrier, can plan the repair/replacement work for the communication control device that includes the crystal oscillator 100 (the crystal oscillator 100 in which the pre-output stop state was detected).

The gain control circuit 260 has a function of increasing the gain of the inverting amplifier 206 in synchronization with the occurrence of the alarm. That is, when an alarm from the alarm issuing circuit 250 is input, the gain control circuit 260 increases the gain of the inverting amplifier 206 from a first value to a second value. The second value is significantly greater than the first value, for example the maximum value of the variable range. This increases the amplitude of the output from the inverting amplifier 206 and increases the amplitude of the input to the output buffer 208. In the example illustrated in FIG. 5, when the alarm from the alarm issuing circuit 250 is input, the gain control circuit 260 controls the switch SW to switch from the first state to the second state (see the arrow in FIG. 5). As a result, the gain of the inverting amplifier 206 increases from R2/R1 to R3/R1.

The gain control circuit 260 maintains the gain of the inverting amplifier 206 at the first value until the alarm from the alarm issuing circuit 250 is input, and when the alarm is input, the gain of the inverting amplifier 206 is set to the second value, and thereafter, the gain of the inverting amplifier 206 is maintained at the second value. In this case, the first value (R2/R1) is smaller than the second value (R3/R1). Accordingly, while power saving is implemented until the alarm from the alarm issuing circuit 250 is input, the state in which the gain of the inverting amplifier 206 is increased can be maintained after the alarm from the alarm issuing circuit 250 is input.

The reference voltage generating unit 270 generates a voltage corresponding to the reference value β used in the alarm issuing circuit 250. For example, the voltage generated by the reference voltage generating unit 270 may be input to a comparator (not illustrated) of the alarm issuing circuit 250.

Next, with reference to FIGS. 6 to 8D, effects of the first embodiment are described. Hereinafter, in some cases, the effects of the first embodiment will be described in comparison with a comparative example which does not include the gain control circuit 260.

FIG. 6 is an explanatory diagram of characteristics in a case where the crystal oscillator 100 is a normal product.

FIG. 6 illustrates, on the upper side, a frequency characteristic diagram illustrating the time-varying characteristics of the output frequency of the crystal oscillator 100, taking the time on the horizontal axis and the output frequency of the crystal oscillator 100 on the vertical axis. In the frequency characteristic diagram, a frequency standard lower limit value with respect to the output frequency of the crystal oscillator 100 is illustrated, and the time variation characteristic F1 related to a normal product is illustrated.

FIG. 6 illustrates, on the lower side, an output change characteristic diagram indicating the time-varying characteristics C1a, C1b, C1c of the amplitudes at each point A, B, C, respectively, taking the time on the horizontal axis and the amplitude of the signal appearing at each point A, B, C in the oscillation circuit illustrated in FIG. 4 on the vertical axis. In the output change characteristic diagram, the input lower limit value of the output buffer 208 is also illustrated.

In the case of a normal product, the output frequency of the crystal oscillator 100 decreases from the value f0 in a proportional manner with respect to the exponential increase in time, as illustrated by the time variation characteristic F1 on the upper side of FIG. 6 due to aging (aged deterioration). However, in the case of a normal product, the output frequency of the crystal oscillator 100 does not fall below the frequency standard lower limit value before the design life (for example, 6 years). It is noted that the main cause of the frequency change is the oxidation of the excitation electrodes 20 of the crystal oscillator 100. The amount of the frequency change due to aging can be controlled to some extent by management of the manufacturing process or the like. If the crystal oscillator 100 is as designed, the output frequency of the crystal oscillator 100 does not fall below the frequency standard lower limit value before the design life, as illustrated in FIG. 6.

In the case of a normal product, the amplitude of the signal appearing at the point B in the oscillation circuit illustrated in FIG. 4 decreases due to aging as indicated by the time variation characteristic C1b on the lower side of FIG. 6. As in the case of the frequency change, the main cause of the amplitude change is the mass increase due to the oxidation of the excitation electrode 20 of the crystal oscillator 100. However, in the case of a normal product, before the design life, the amplitude of the signal appearing at the point B illustrated in FIG. 4 does not fall below the input lower limit value of the output buffer 208. That is, if the crystal oscillator device is configured as designed, the amplitude of the input to the output buffer 208 does not fall below the input lower limit value before the design life. Therefore, in the case of a normal product, the amplitude of the signal appearing at the point C illustrated in FIG. 4 does not change and is constant as indicated by the time variation characteristic C1c on the lower side of FIG. 6. That is, in the case of a normal product, until the design life, the output (that is, normal output) switching between "VOH" and "VOL" at the cycle corresponding to the output frequency of the crystal oscillator 100 can be obtained at the point C illustrated in FIG. 4.

Figure 8B:
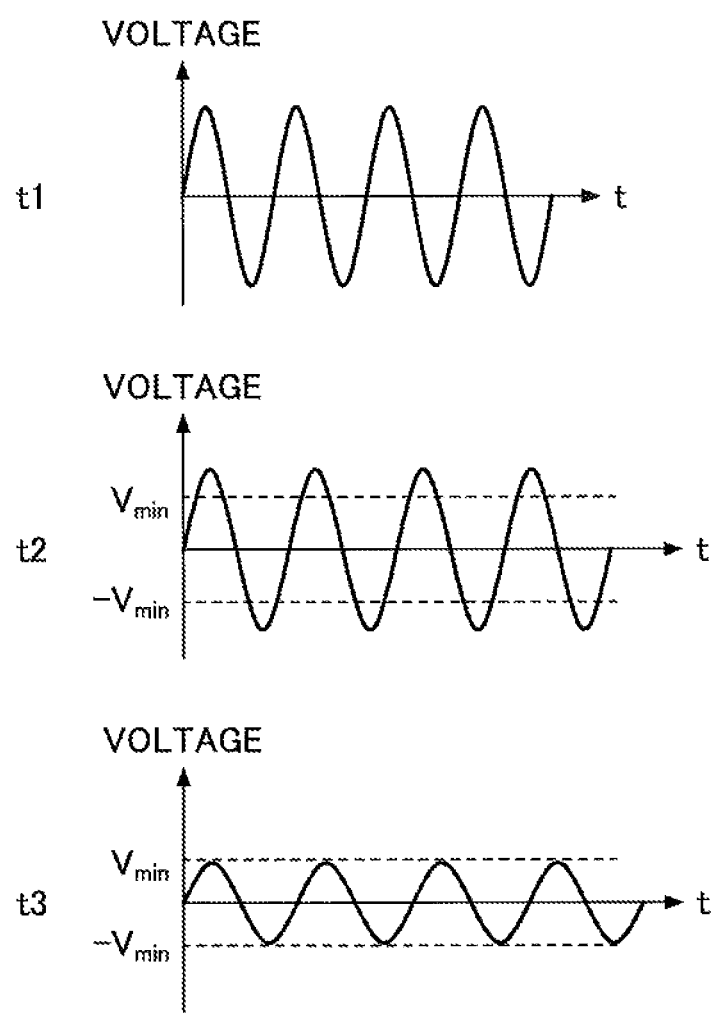
FIG. 8B is a diagram illustrating a time-series waveform of a signal appearing at a point B in the case of an abnormal product.
Figure 8D:
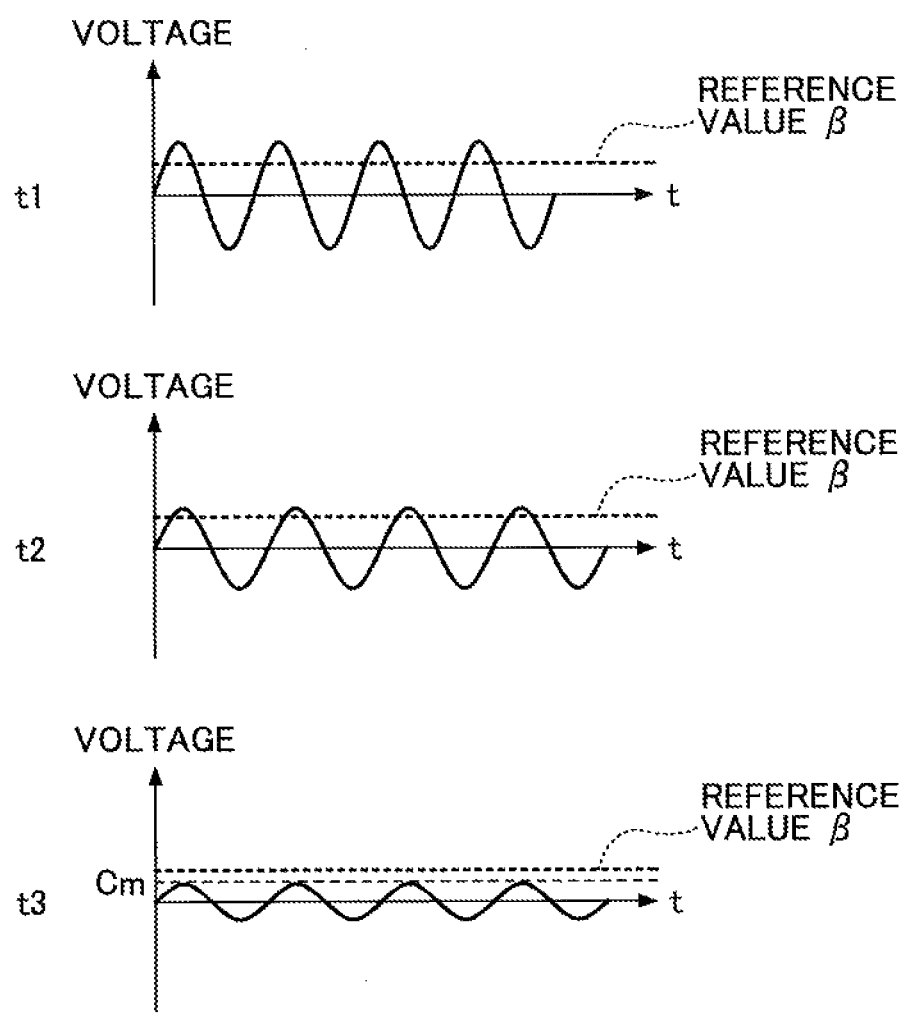
FIG. 8D is a diagram illustrating a time-series waveform of a signal appearing in the coil in the case of an abnormal product.

FIGS. 7 to 8D are explanatory diagrams of output stoppage of the crystal oscillator 100 caused by abnormality. In FIG. 7, t1 represents a time point at which the crystal oscillator 100 starts to operate, t2 represents a time point immediately before the crystal oscillator 100 stops outputting, t3 represents a time point when the crystal oscillator 100 stops outputting, and t4 represents the point of design life.

FIG. 7 illustrates, on the upper side, a frequency characteristic diagram illustrating the time-varying characteristics of the output frequency of the crystal oscillator 100, taking the time on the horizontal axis and the output frequency of the crystal oscillator 100 on the vertical axis. In the frequency characteristic diagram, the frequency standard lower limit value with respect to the output frequency of the crystal oscillator 100 is illustrated, and the time variation characteristic F1 (dotted line) related to a normal product and the time variation characteristic F2 (solid line) related to an abnormal product that stops outputting before the design life are illustrated. As an example, the time variation characteristic F2 relating to an abnormal product indicates a case where the output stops after about 100 days from the start of operation.

FIG. 7 illustrates, on the lower side, an output change characteristic diagram indicating the time-varying characteristics C2a, C2b, C2c (i.e., the time-varying characteristics related to an abnormal product) of the amplitudes at each point A, B, C, respectively, taking the time on the horizontal axis and the amplitude of the signal appearing at each point A, B, C in the oscillation circuit illustrated in FIG. 4 on the vertical axis. In the output change characteristic diagram, the input lower limit value of the output buffer 208, and the time variation characteristic C1c (dotted line) related to a normal product are also illustrated.

FIGS. 8A to 8D are diagrams illustrating time-series waveforms of the signal appearing in the case of an abnormal product. FIG. 8A illustrates the waveform of the signal appearing at point A illustrated in FIG. 4. FIG. 8B illustrates the waveform of the signal appearing at point B illustrated in FIG. 4. FIG. 8C illustrates the waveform of the signal appearing at point C illustrated in FIG. 4. FIG. 8D illustrates the waveform of the signal appearing in the coil 50. In FIG. 8A to FIG. 8D, from the top, the waveform within a certain time period from the time point t1, the waveform within a certain time period before time point t2, and the waveform within a certain time period from time point t3 are illustrated. In FIG. 8B, a positive voltage value Vmin having the same magnitude as the input lower limit value and a negative voltage value Vmin having the same magnitude as the input lower limit value are also illustrated. In addition, in FIG. 8C, the voltage level "High" to be exceeded in a positive direction by the output VOH and the voltage level "Low" to be exceeded in a negative direction by the output VOL are also illustrated. In addition, the reference value β is also illustrated in FIG. 8D.

Here, there are cases where the decrease rate of the output frequency of the crystal oscillator 100 and the oscillation level become significant due to abnormality of a manufacturing process or contamination from contaminants. In such a case, an abnormal product that causes output stoppage before the design life may be generated.

Specifically, in the case of an abnormal product, the output frequency of the crystal oscillator 100 decreases from the initial value f0 with decrease speed significantly higher than the decrease speed due to aging in a normal product, as illustrated in the time variation characteristic F2 on the upper side of FIG. 7. In the case where the output of the crystal oscillator 100 is used as the clock of the standalone system, even if the frequency decrease progresses up to the time t2, there is a possibility that the frequency decrease may be permissible with a slight decrease in calculation speed. However, at time t3, the output suddenly stops and the whole system goes down.

More specifically, in the case of an abnormal product, the amplitude of the signal appearing at the point A in the oscillation circuit illustrated in FIG. 4 decreases by a significantly greater amount than the decrease amount due to aging in the case of a normal product, as illustrated in the time variation characteristic C2a on the lower side in FIG. 7 and FIG. 8A. Correspondingly, in the case of an abnormal product, the amplitude of the signal appearing at the point B in the oscillation circuit illustrated in FIG. 4 decreases by a significantly greater amount than the decrease amount due to aging in the case of a normal product, as illustrated in the time variation characteristic C2b on the lower side in FIG. 7 and FIG. 8B. Thus, in the case of an abnormal product, before the design life, the amplitude of the signal appearing at the point B illustrated in FIG. 4 may fall below the input lower limit value of the output buffer 208.

In this respect, in the case of an abnormal product illustrated in FIG. 7, in the comparative example, the amplitude of the signal appearing at the point B in the oscillation circuit illustrated in FIG. 4 falls below the input lower limit value of the output buffer 208 at the time t3, as illustrated in the time variation characteristic C2b on the lower side of FIG. 7 and FIG. 8B. In this way, in the case of an abnormal product illustrated in FIG. 7, the amplitude of the signal appearing at the point B in the oscillation circuit illustrated in FIG. 4, that is, the amplitude of the input to the output buffer 208 falls below the input lower limit value before the design life. If the amplitude of the input to the output buffer 208 falls below the input lower limit value of the output buffer 208, the signal level appearing at the point C illustrated in FIG. 4 becomes a constant value 0, as illustrated in the time variation characteristic C2c on the lower side of FIG. 7 and FIG. 8C. That is, prior to the design life, the crystal oscillator 100 stops outputting while the crystal oscillator 100 remains in the oscillation state (see FIG. 8A).

Here, the abnormality of the crystal oscillator 100 often causes abnormal frequency change. Since the oscillation circuit including the crystal oscillator 100 itself is a clock generation source, a reference clock with higher accuracy may be required to directly detect the frequency change of the crystal oscillator 100. Therefore, it is difficult to detect the abnormality in the frequency of the crystal oscillator 100 (for example, a characteristic like the time variation characteristic F2 in FIG. 7) by a simple method.

In this respect, the frequency change of the crystal oscillator 100 due to contamination from contaminants or the like correlates with the change (decrease) in the oscillation level of the crystal oscillator 100 as illustrated in FIGS. 6 and 7. This is because, in the case where the mass of the excitation electrodes 20 is increased due to contamination from contaminants, for example, both the output frequency and the oscillation level of the crystal oscillator 100 are reduced due to the mass increase. Therefore, even when the frequency change of the crystal oscillator 100 cannot be directly detected, it may be possible to indirectly detect the frequency change of the crystal oscillator 100 by monitoring the oscillation level of the crystal oscillator 100.

On the other hand, as described above, the output of the crystal oscillator 100 is not directly output from the oscillation circuit including the crystal oscillator 100 but output through the output buffer 208. As illustrated in FIG. 7, etc., as long as the amplitude of the input exceeds the input lower limit value of the output buffer 208, the output of the output buffer 208 oscillates between the output VOH and the output VOL at the frequency that corresponds to the output frequency, even in the case of an abnormal product. The levels of the output VOH and the output VOL are substantially constant as long as the amplitude of the input exceeds the input lower limit value of the output buffer 208 even in the case of an abnormal product. Therefore, based on the output from the output buffer 208, it is not possible to directly read the abnormality of the oscillation circuit (for example, the abnormality of the crystal oscillator 100). Therefore, the failure of the oscillation circuit including the crystal oscillator 100 is often recognized only when its output falls below the standard (for example, the frequency standard lower limit value) or when the output stops. It is noted that there may be often the case that the main cause of failure of the oscillation circuit resulted from the crystal oscillator 100 included therein.

As described above, the abnormality of the crystal oscillator 100 is often known only after the crystal oscillator 100 has stopped outputting. This means that the repair/replacement timing of the crystal oscillator 100 suddenly comes in, which is significantly inconvenient for a user of a system using an output from the oscillation circuit including the crystal oscillator 100 as a clock source. Especially, when the crystal oscillator 100 is used in a system that requires high reliability, the adverse effect when the system suddenly goes down may be significant. In addition, when the crystal oscillator 100 is used in a relay station device or the like installed in a remote mountainous area or the like, it may take time to repair or exchange it, which may increase the down time of the system. Although such a disadvantage can be avoided to some extent by providing a redundant system, providing a redundant system adds cost.

In this regard, according to the first embodiment, as described above, the alarm issuing circuit 250 generates the alarm when the amplitude of the signal appearing in the coil 50 becomes equal to or less than the reference value β. As described above, the reference value β is set to a value greater than the amplitude Cm of the signal when the amplitude of the input to the output buffer 208 becomes the input lower limit value. Therefore, according to the first embodiment, the alarm can be generated by the alarm issuing circuit 250 before the amplitude of the signal appearing at the point B in the oscillation circuit illustrated in FIG. 4 falls below the input lower limit value of the output buffer 208. As a result, it is possible to notify the user of the system using the output from the oscillation circuit including the crystal oscillator 100 as the clock source in advance the necessity of repair/replacement due to the alarm. That is, before the crystal oscillator 100 stops outputting, the user can be notified of necessity of repair/replacement by the alarm in advance. As a result, it is possible to avoid situations where the system suddenly goes down if the user, who is notified of necessity of repair/replacement by the alarm in advance, plans appropriate repair/replacement work.

In addition, according to the first embodiment, as described above, the gain control circuit 260 increases the gain of the inverting amplifier 206 in synchronization with the occurrence of the alarm. When the gain of the inverting amplifier 206 is increased, the amplitude of the output from the inverting amplifier 206 (the amplitude of the input to the output buffer 208) increases. Therefore, according to the first embodiment, the amplitude of the input to the output buffer 208 can be increased in synchronization with the occurrence of the alarm, and as a result, the period until the crystal oscillator 100 stops outputting can be extended. That is, according to the first embodiment, even in the case of an abnormal product, the period until the crystal oscillator 100 stops outputting can be extended in response to the occurrence of the alarm. As a result, it becomes easier for the user to secure the necessary time for executing appropriate repair/replacement work. This effect is particularly useful when the crystal oscillator 100 is used for a relay station apparatus or the like installed in a remote mountainous area or the like. This is because, in such a case, it takes time for repair and exchange work in many cases.

Further, in the above-described first embodiment, since the output of the crystal oscillator 100 in the oscillating state can be monitored via the coil 50 and the magnet 59, a monitoring system independent of the oscillation circuit can be formed. Therefore, according to the first embodiment, it is possible to monitor the output of the crystal oscillator 100 in the oscillating state in a manner that does not affect the oscillation circuit.

FIG. 9 is a diagram explaining an example of an operation according to the first embodiment. In FIG. 9, t1 represents a time point at which the crystal oscillator 100 starts to operate, t5 represents a detection time of the pre-output stop state, t6 represents a time point when the crystal oscillator 100 stops outputting, and t4 represents the point of design life. Further, in FIG. 9, the output stop time t3 in the case of FIG. 7 is illustrated for comparison. FIG. 9 illustrates a case where the crystal oscillator 100 is not repaired or replaced until the crystal oscillator 100 stops outputting.

FIG. 9 illustrates, as in the case of FIG. 7 described above, on the upper side, a frequency characteristic diagram illustrating the time-varying characteristics of the output frequency of the crystal oscillator 100, taking the time on the horizontal axis and the output frequency of the crystal oscillator 100 on the vertical axis. In the frequency characteristic diagram, the frequency standard lower limit value with respect to the output frequency of the crystal oscillator 100 is illustrated, and the time variation characteristic F1 (dotted line) related to a normal product and the time variation characteristic F3 (solid line) related to an abnormal product that stops outputting before the design life are illustrated. The abnormal product in FIG. 9 is assumed to be the same as the abnormal product in FIG. 7.

FIG. 9 illustrates, similar to FIG. 7, on the lower side, an output change characteristic diagram indicating the time-varying characteristics C3a, C3b, C3c, C3d (i.e., the time-varying characteristics related to an abnormal product), taking the time on the horizontal axis and the amplitude. Time-varying characteristics C3d is the time-varying characteristics of the amplitude of the signal appearing in the coil 50 (the same characteristics according to an abnormal product). In the output change characteristic diagram, the input lower limit value of the output buffer 208, the reference value β, and the time variation characteristic C1c (dotted line) related to a normal product are also illustrated.

In the case of an abnormal product, similar to FIG. 7, the output frequency of the crystal oscillator 100 is significantly higher than the decrease speed due to aging in a normal product, as illustrated in the time variation characteristic F3 on the upper side of FIG. 9. However, in the first embodiment, as described above, unlike FIG. 7, the gain control circuit 260 functions to prevent the entire system from stopping outputting and thus being down at time t3. That is, even in the case of an abnormal product, as illustrated in the time varying characteristic F3 at the top of FIG. 9, until time t6 after time t3, it is possible to delay the timing at which the entire system is down. It is noted that, in the example illustrated in FIG. 9, a timing when the output frequency of the crystal oscillator 100 falls below the frequency standard lower limit value is the same as a timing when the entire system is down (i.e., the timing at which the level of the signal appearing at point C becomes the constant value 0); however, this is not indispensable. However, preferably, the timing, at which the output frequency of the crystal oscillator 100 falls below the frequency standard lower limit value, does not arrive before the timing at which the entire system is down.

Further, in the case of an abnormal product, the amplitude of the signal appearing at the point A in the oscillation circuit illustrated in FIG. 4 decreases by a significantly greater amount than the decrease due to aging in the case of a normal product, as illustrated in the time variation characteristic C3a on the lower side in FIG. 9. Thus, in the case of an abnormal product, the amplitude of the signal appearing at the point B in the oscillation circuit illustrated in FIG. 4 decreases by a significantly greater amount than the decrease due to aging in the case of a normal product, as illustrated in the time variation characteristic C3b on the lower side in FIG. 9. Thus, in the case of an abnormal product, similar to FIG. 7, before the design life, the amplitude of the signal appearing at the point B illustrated in FIG. 4 may fall below the input lower limit value of the output buffer 208.

In this regard, according to the first embodiment, as schematically illustrated by an arrow at the bottom of FIG.

9, the alarm is generated at time t5 at which the amplitude of the signal appearing in the coil 50 is equal to or less than a reference value β. Accordingly, the gain of the inverting amplifier 206 is increased, and, as illustrated in the time varying characteristic C3b at the lower side of FIG. 9, the amplitude (i.e., the amplitude of the input to the output buffer 208) of the signal appearing at point B in the oscillation circuit illustrated in FIG. 4 increases. It is noted that, accordingly, the oscillation level of the crystal oscillator 100 is increased, the amplitude of the signal appearing at point A in the oscillation circuit illustrated in FIG. 4 increases, as illustrated in the time varying characteristic C3a at the lower side of FIG. 9. Thus, at time t5, the amplitude of the signal appearing at point B in the oscillation circuit illustrated in FIG. 4 increases. However, because of an abnormal product, even at time t5, the amplitude of the signal appearing at point B in the oscillation circuit illustrated in FIG. 4 continues to decrease by the decrease amount significantly greater than the decrease amount due to the aging of a normal product. Then, before the design life, the amplitude of the signal appearing at the point B illustrated in FIG. 4 may fall below the input lower limit value of the output buffer 208. In the case of an abnormal product illustrated in FIG. 9, the amplitude of the signal appearing at the point B in the oscillation circuit illustrated in FIG. 4 falls below the input lower limit value of the output buffer 208 at the time t6, as illustrated in the time variation characteristic C3b on the lower side of FIG. 9. In this way, in the case of an abnormal product illustrated in FIG. 9, the amplitude of the signal appearing at the point B in the oscillation circuit illustrated in FIG. 4, that is, the amplitude of the input to the output buffer 208 falls below the input lower limit value before the design life, and thus the crystal oscillator 100 transitions to the output stop state. However, in the first embodiment, as can be seen in comparison with FIG. 7, a timing t6 when the crystal oscillator 100 transitions to the output stop state, comes later than the timing t3 in FIG. 7. That is, in the first embodiment, even in the case of an abnormal product, as compared with the comparative example, the timing when the crystal oscillator 100 transitions to the output stop state can be delayed. In other words, in the first embodiment, as compared with the comparative example, the repair or replacement timing of the crystal oscillator 100 can be delayed by a period of time t3 to time t6. It is noted that, in the example illustrated in FIG. 9, if the repair or replacement of the crystal oscillator 100 is performed during the period from time t3 to time t6, it is possible to avoid a situation where the system ends up down suddenly at time t6.

It is noted that, in the first embodiment described above, the functions of the alarm issuing circuit 250, the gain control circuit 260, and the reference voltage generating unit 270 are implemented by the IC 200; however, at least a part of the functions may be realized by a computer. For example, the functions of the alarm issuing circuit 250 and the gain control circuit 260 may be implemented by a CPU of the computer executing a program, and the function of the reference voltage generating unit 270 may be implemented by a memory of the computer.

Second Embodiment

A crystal oscillator device according to the second embodiment differs from the crystal oscillator device according to the first embodiment described above in that the crystal oscillator 100 is replaced with a crystal oscillator 100C. The crystal oscillator 100C according to the second embodiment differs from the crystal oscillator 100 according to the first embodiment described above in that the coil 50 is replaced with a coil 50C. Other elements of the crystal oscillator 100C according to the second embodiment may be the same as those of the crystal oscillator 100 according to the first embodiment described above, and explanation thereof is omitted.

FIG. 10 is a diagram explaining an example of implementation of a magnet 59 according to the second embodiment, and a two-side view (plan views illustrating an upper surface and a lower surface) of a crystal piece 10. In FIG. 10 (and FIG. 11 as well), a polarity (N pole, S pole) of the magnet 59 is schematically illustrated as "N" and "S".

As illustrated in FIG. 10, in the second embodiment, the coil 50C is not formed on the crystal piece 10. That is, in the second embodiment, as illustrated in FIG. 10, on the crystal piece 10, the magnet 59 is formed in the same manner as in the first embodiment described above.

Figure 11:
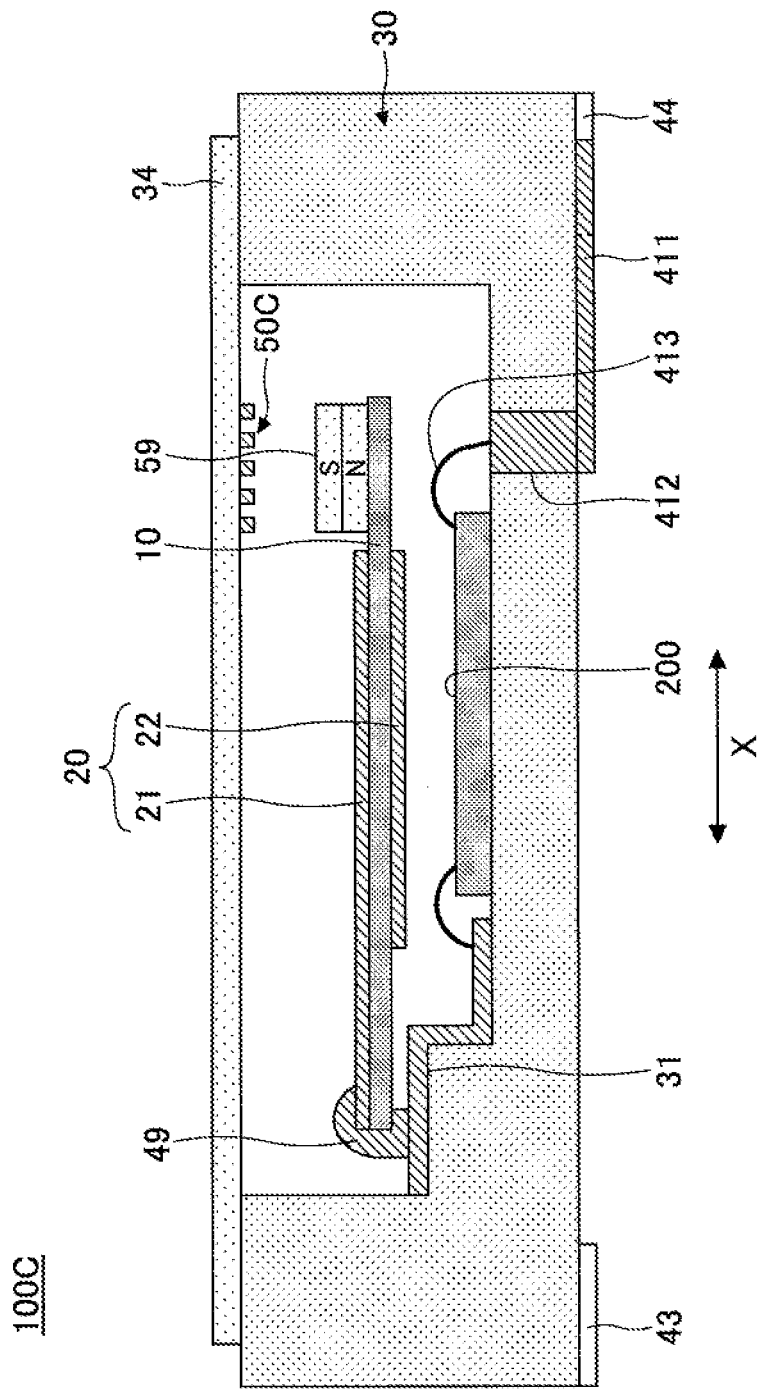
FIG. 11 is a diagram schematically illustrating coil implementation.
Figure 12:
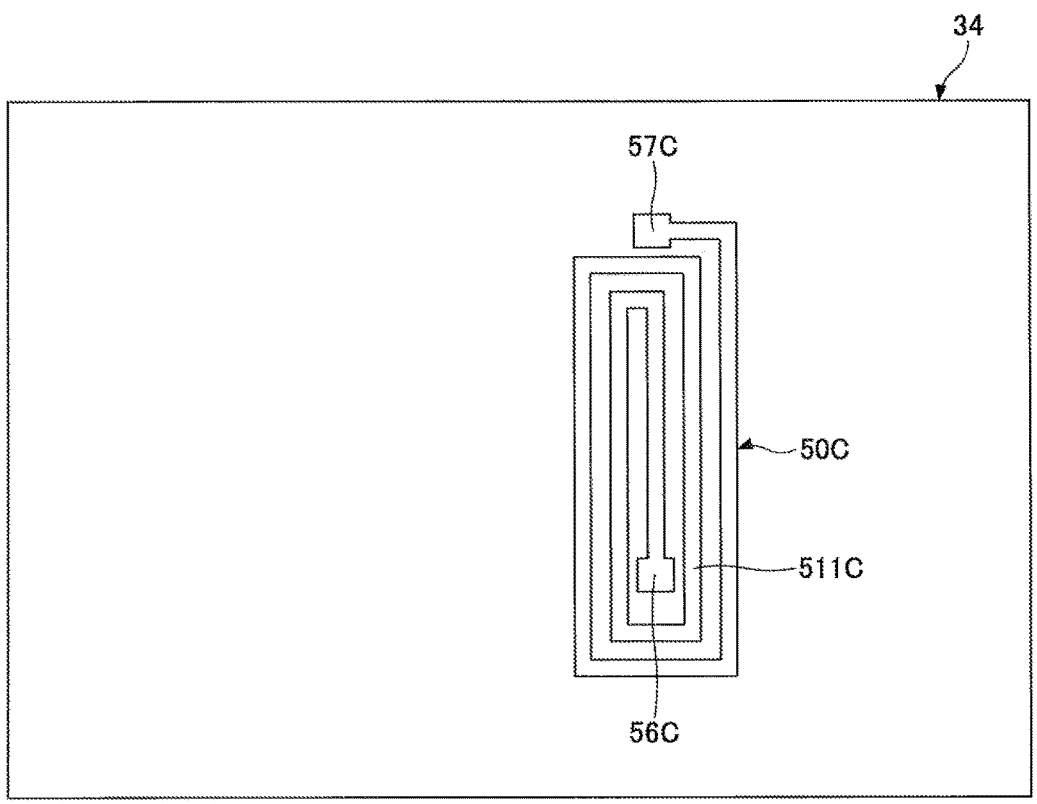
FIG. 12 is a plan view illustrating a lower surface of a lid.

FIG. 11 is a section-view schematically illustrating implementation example of the coil 50C, FIG. 12 is a plan view viewing the lower surface of the lid 34.

The coil 50C may be disposed at any location where the magnetic flux from the magnet 59 can pass through the coil 50C. For example, the coil 50C is formed in the lid 34 of the casing 30, as illustrated in FIGS. 11 and 12. In the example illustrated in FIGS. 11 and 12, the coil 50C is formed on the lower surface of the lid 34 of the casing 30; however, the coil 50C may be formed on the upper surface of the lid 34. Further, the coil 50C may be disposed on the upper surface of the IC 200, or may be formed on the inner surface of the lower part of the casing 30.

It is noted that in the example illustrated in FIG. 12, the coil 50C includes a coil pattern portion 511C, through holes 56C, 57C on opposite ends of the coil pattern portion 511C. The coil 50C may be electrically connected to the IC (not illustrated) via the through holes 56C, 57C.

Also, according to the second embodiment, the same effects as in the first embodiment can be obtained.

It is noted that, in the second embodiment, the coil 50C is provided in place other than on the crystal piece 10 of the crystal oscillator 100C; however, the coil 50C may be provided outside the casing 30 of the crystal oscillator 100C, for example, together with IC 200.

Third Embodiment

A crystal oscillator device according to the third embodiment differs from the crystal oscillator device according to the first embodiment described above in that the crystal oscillator 100 is replaced with a crystal oscillator 100D. The crystal oscillator 100D according to the third embodiment differs from the crystal oscillator 100 according to the first embodiment described above in that the coil 50 and the magnet 59 are replaced with a coil 50D and a magnet 59D, respectively. Further, the crystal oscillator 100D according to the third embodiment differs from the crystal oscillator 100 according to the first embodiment described above in that a coil substrate 510 is added. Other elements of the crystal oscillator 100D according to the second embodiment may be the same as those of the crystal oscillator 100 according to the first embodiment described above, and explanation thereof is omitted.

FIG. 13 is a diagram explaining an example of implementation of the magnet 59D according to the third embodiment, and a two-side view (plan views illustrating an upper surface and a lower surface) of a crystal piece 10. In FIG. 13

(and FIG. 14 as well), a polarity (N pole, S pole) of the magnet 59 is schematically illustrated as "N" and "S".

As illustrated in FIG. 13, in the third embodiment, the coil 50D is not formed on the crystal piece 10. That is, according to the third embodiment, as illustrated in FIG. 13, the magnet 59D is provided on the crystal piece 10. Specifically, the magnet 59D is disposed on the upper surface of the upper excitation electrode 21. It is noted that either of the N pole and the S pole in the magnet 59D may be on the upper side.

Figure 14:
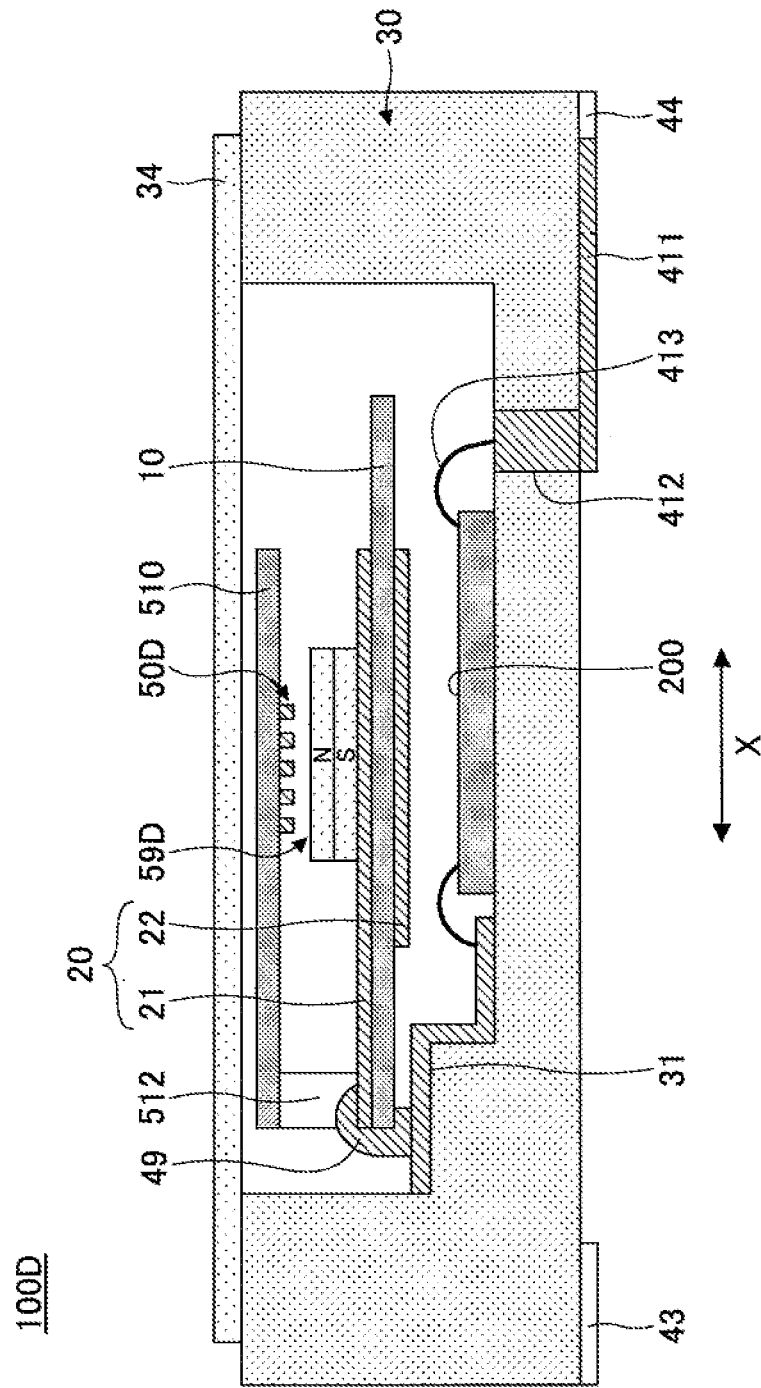
FIG. 14 is a diagram schematically illustrating coil implementation.

FIG. 14 is a section-view schematically illustrating implementation of the coil 50D, and FIG. 15 is two-view diagram of the coil substrate 510 (plan view of an upper surface and a lower surface thereof).

The coil 50D may be disposed at any location where the magnetic flux from the magnet 59D can pass through the coil 50D. For example, the coil 50D may be formed on the coil substrate 510 which is provided in parallel to the upper excitation electrode 21, as illustrated in FIGS. 14 and 15. Alternatively, as in the second embodiment described above, the coil 50D may be formed in the lid 34 of the casing 30. Alternatively, the coil 50D may be disposed on the upper surface of the IC 200, or may be formed on the inner surface of the lower part of the casing 30.

In the example illustrated in FIGS. 14 and 15, the coil 50D includes a coil pattern portion 511D, wiring portions 512D, 514D, and 515D, and through-holes 56D and 57D. The coil pattern portion 511D is formed in a spiral form on the lower surface of the coil substrate 510. The coil pattern portion 511D is formed at a position where the coil pattern portion 511D is opposed to the magnet 59D in the vertical direction. One end of the coil pattern portion 511D is electrically connected to an electrode 54D, which is formed on the lower surface of the coil substrate 510, via the wiring portion 514D formed on the lower surface of the coil substrate 510. The other end of the coil pattern portion 511D (the end on the center side of the turns in a plan view) is drawn on the upper surface of the coil substrate 510 via the through hole 56D. On the upper surface of the coil substrate 510, the wiring portion 512D is formed. The ends of the wiring portions 512D are electrically connected to the through holes 56D and 57D. On the lower surface of the coil substrate 510, the wiring portion 515D is formed. The wiring portion 515D electrically connects the through hole 57D and an electrode 52D formed on the lower surface of the coil substrate 510. In this way, the other end of the coil pattern portion 511D is electrically connected to the electrode 52D via the through hole 56D, the wiring portion 512D, the through hole 57D, and the wiring portion 515D. The electrodes 52D, 54D, respectively, are electrically connected to IC 200 via a conductive adhesive 512 (see FIG. 14).

It is noted that, in the example illustrated in FIGS. 14 and 15, the coil 50D includes the coil pattern portion 511D formed on the lower surface of the coil substrate 510; however, the coil pattern portion 511D may be formed on the upper surface of the coil substrate 510.

Also, according to the third embodiment, the same effects as in the first embodiment can be obtained.

It is noted that, in the third embodiment, the coil 50D is provided in place other than on the crystal piece 10 of the crystal oscillator 100D; however, the coil 50D may be provided outside the casing 30 of the crystal oscillator 100D, for example, together with the IC 200.

Fourth Embodiment

The crystal oscillator device according to the fourth embodiment differs from the crystal oscillator device according to the first embodiment in that the crystal oscillator 100 and the IC 200 are replaced with a crystal oscillator 100F and an IC 200F, respectively. The crystal oscillator 100F according to the fourth embodiment differs from the crystal oscillator 100 according to the first embodiment described above in that the excitation electrodes 20 are replaced with excitation electrodes 20F. Further, the crystal oscillator 100F according to the fourth embodiment differs from the crystal oscillator 100 according to the first embodiment described above in that the coil 50 and the magnet 59 are replaced with a coil 50F. Further, the crystal oscillator 100F according to the fourth embodiment differs from the crystal oscillator 100 according to the first embodiment described above in that a coil substrate 510F is added. Other elements of the crystal oscillator 100F according to the second embodiment may be the same as those of the crystal oscillator 100 according to the first embodiment described above, and explanation thereof is omitted.

FIG. 16 is a diagram explaining an example of implementation of the excitation electrodes 20F according to the fourth embodiment, and a two-side view (plan views illustrating an upper surface and a lower surface) of a crystal piece 10.

The excitation electrodes 20F differ from the excitation electrodes 20 according to the first embodiment described above in that the upper excitation electrode 21 and the lower excitation electrode 22 are replaced with an upper excitation electrode 21F (an example of a magnetic material portion) and a lower excitation electrode 22F, respectively.

The upper excitation electrode 21F is formed of a magnetic material having electrical conductivity. The upper excitation electrode 21F may be formed of iron, nickel, cobalt, etc., for example. The upper excitation electrode 21F can be formed (i.e. film formation) in the form of a film. The lower excitation electrode 22F is formed of a non-magnetic material. For example, the lower excitation electrodes 22F may be made of gold, silver, aluminum, or the like. Other configurations of the excitation electrodes 20F may be similar to the excitation electrodes 20 according to the first embodiment described above, and thus are not further described.

Figure 17:
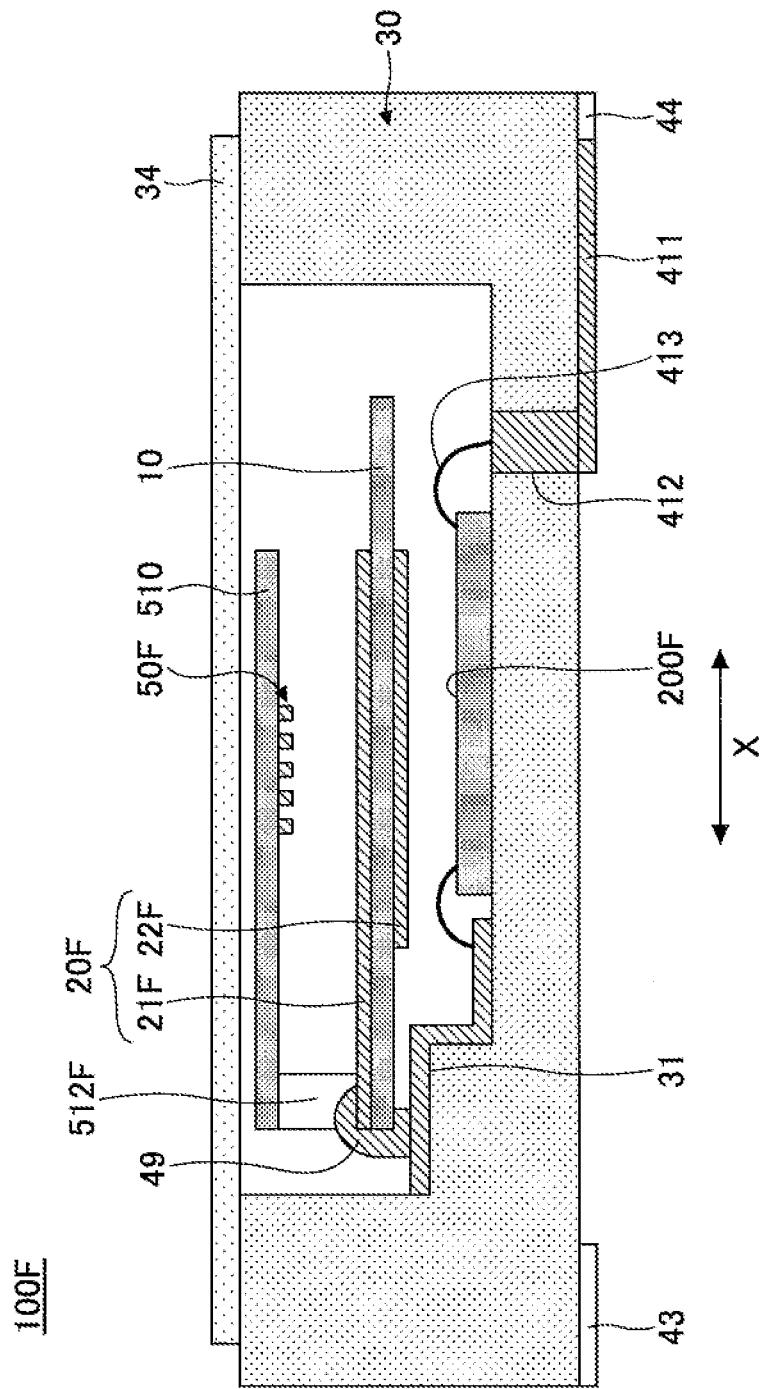
FIG. 17 is a diagram schematically illustrating coil implementation.

FIG. 17 is a section-view schematically illustrating implementation of the coil 50F, and FIG. 18 is two-view diagram of the coil substrate 510F (plan view of an upper surface and a lower surface thereof).

The coil 50F forms an electromagnet to generate a magnetic field as described hereinafter. The coil 50F may be located at any position relative to the upper excitation electrode 21F such that the coil 50F generates a magnetic field that extends to the upper excitation electrode 21F. For example, the coil 50F may be formed on the coil substrate 510F which is provided parallel to the upper excitation electrode 21F, as illustrated in FIGS. 17 and 18. Alternatively, the coil 50F may be formed on the lid 34 of the casing 30. Alternatively, the coil 50F may be disposed on the upper surface of the IC 200F, or may be formed on the inner surface of the lower part of the casing 30.

In the example illustrated in FIGS. 17 and 18, the coil 50F includes a coil pattern unit 511F, wiring portion 512F, 514F, and 515F, and through-holes 56F and 57F. The coil pattern portion 511F is formed in a spiral form on the lower surface of the coil substrate 510F. The coil pattern portion 511F is formed at a position where the coil pattern portion 511F is opposed to the magnet 59F in the vertical direction. One end of the coil pattern portion 511F is electrically connected to an electrode 54F, which is formed on the lower surface of the coil substrate 510F, via the wiring portion 514F formed on the lower surface of the coil substrate 510F. The other end of the coil pattern portion 511F (the end on the center side of the turns in a plan view) is drawn on the upper surface of the coil substrate 510F via the through hole 56F. On the upper surface of the coil substrate 510F, the wiring portion 512F is formed. The ends of the wiring portions 512F are electrically connected to the through holes 56F and 57F. On the lower surface of the coil substrate 510F, the wiring portion 512F is formed. The wiring portion 515F electrically connects the through hole 57F and an electrode 52F formed on the lower surface of the coil substrate 510F. In this way, the other end of the coil pattern portion 511F is electrically connected to the electrode 52F via the through hole 56F, the wiring portion 512F, the through hole 57F, and the wiring portion 515F. The electrodes 52F, 54F, respectively, are electrically connected to the IC 200F via a conductive adhesive 512F (see FIG. 17).

It is noted that, in the example illustrated in FIGS. 17 and 18, the coil 50F includes the coil pattern portion 511F formed on the lower surface of the coil substrate 510F; however, the coil pattern portion 511F may be formed on the upper surface of the coil substrate 510F. Further, the coil 50F may be formed on the upper surface or the lower surface of the lid 34 of the casing 30. Further, the coil 50F may be disposed on the upper surface of the IC 200F, or may be formed on the inner surface of the lower part of the casing 30.

Figure 19:
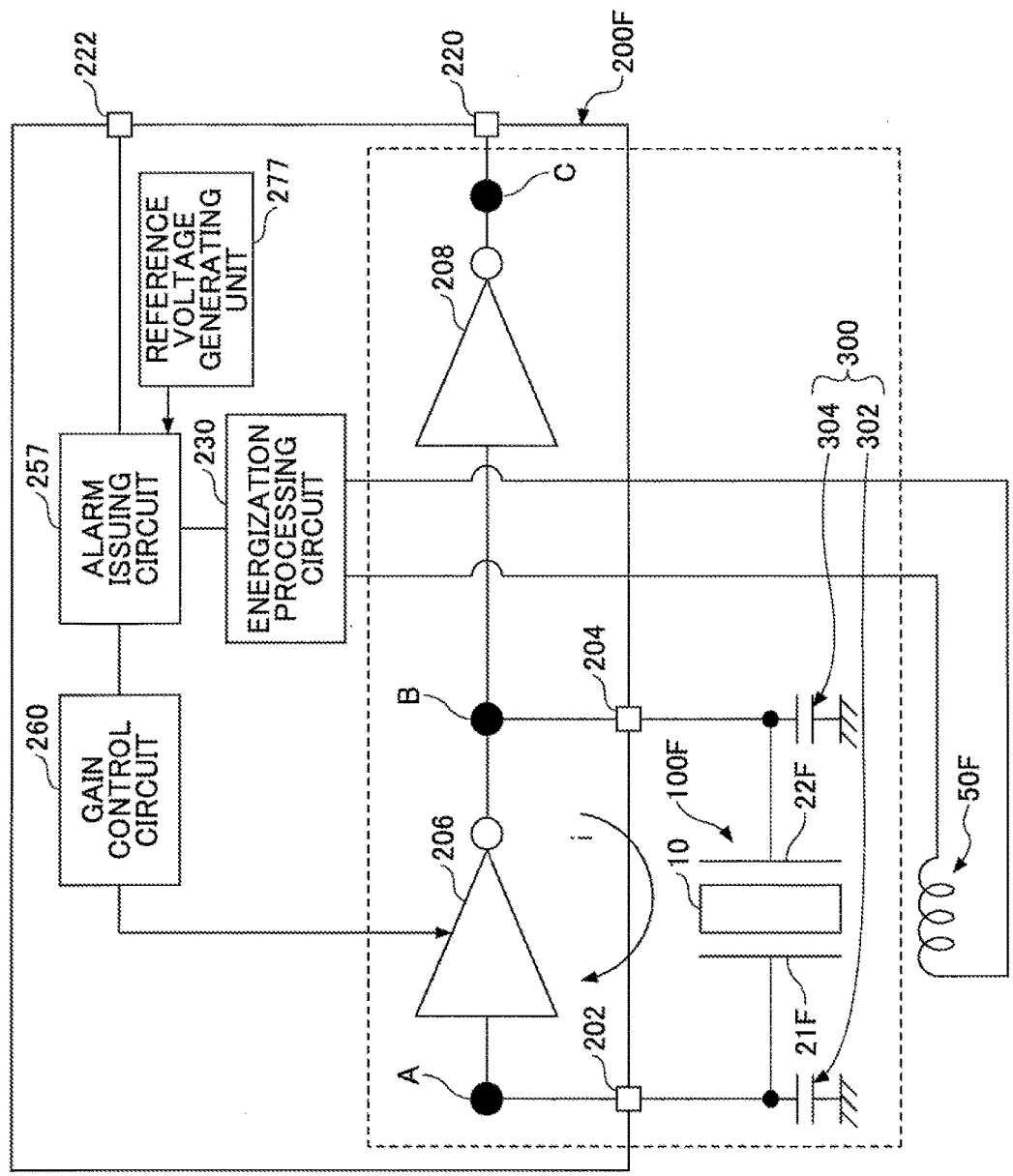
FIG. 19 is a diagram schematically illustrating an example of a circuit configuration of a crystal oscillator device (according to a second embodiment) including a crystal oscillator and an IC.
Figure 20:
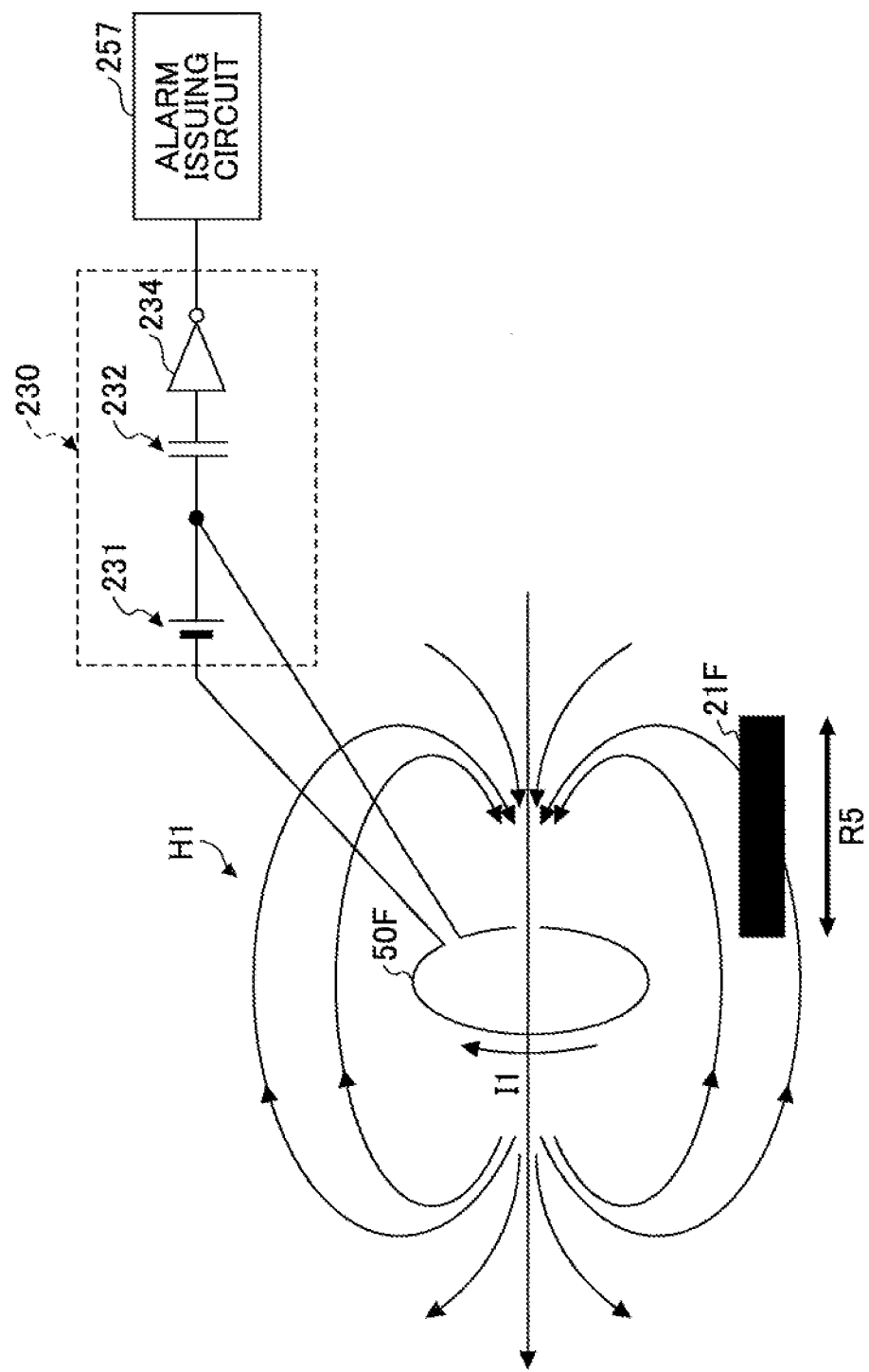
FIG. 20 is an explanatory diagram of a generation principle of an AC waveform and an electromagnet circuit.

FIG. 19 is a diagram schematically illustrating an example of a circuit configuration of the crystal oscillator device including the crystal oscillator 100F and the IC 200F. FIG. 20 is an explanatory diagram of a generation principle of an AC waveform and an energization processing circuit 230. In FIG. 19, with respect to IC 200F, capacitors of terminals, stray capacitance of wiring patterns of the printed circuit board, resistance for limiting the current (see arrow i in FIG. 19) flowing through the crystal oscillator 100F, etc., are not illustrated. In FIG. 19, elements which may be the same as the corresponding elements according to the first embodiment described above are given the same reference numerals and their explanation is omitted.

The IC 200F differs from the IC 200 according to the first embodiment described above in that the alarm issuing circuit 250 and the reference voltage generating unit 270 are replaced with an alarm issuing circuit 257 and a reference voltage generating unit 277, respectively. Further, the IC 200F differs from the IC 200 according to the first embodiment described above in that the energization processing circuit 230 is added. It is noted that the IC 200 forms an example of a crystal oscillator device together with the crystal oscillator 100F.

The energization processing circuit 230 is electrically connected to the coil 50F. The energization processing circuit 230 includes a DC power source 231, a capacitor 232, and an amplifier 234, for example, as illustrated in FIG. 20.

In the oscillating state of the crystal oscillator 100F, the crystal piece 10 oscillates at a certain frequency such that the upper excitation electrode 21F oscillates at the corresponding frequency (thickness shear vibration). At this time, as illustrated in FIG. 20, in the coil 50F that is disposed above the upper excitation electrode 21F, the frequency of the AC waveform corresponding to the output frequency of the crystal piece 10 due to the vibration of the upper excitation electrode 21F is generated. Specifically, the coil 50F is a coil of the electromagnet to form a magnetic field H1 which extends to the upper excitation electrode 21F, when energized by the DC power source 231, as schematically illustrated in FIG. 20. In this case, as schematically illustrated in FIG. 20, when the upper excitation electrode 21F oscillates (see arrow R5), the magnetic field H1 is affected by oscillation of the upper excitation electrode 21F which is a magnetic body. In other words, there is a change generated in the magnetic flux in accordance with the vibration of the upper excitation electrode 21F which is a magnetic material, and correspondingly an electromotive force generated in the coil 50F (in the coil pattern portion 511F) in a direction to prevent the change. As a result, an AC waveform having a frequency corresponding to the output frequency of the crystal piece 10 is superimposed on the current I1 flowing through the coil 50F. Therefore, as schematically illustrated in FIG. 20, by providing the coil 50F outside of the crystal oscillator 100F, such an AC waveform can be generated in the coil 50F. It is noted that, in the example illustrated in FIG. 20, a reception signal including the AC waveform generated in the coil 50F has the DC component cut by the capacitor 232 such that the AC component is amplified by the amplifier 234. The amplified AC component is applied to the alarm issuing circuit 257. The frequency and amplitude of the voltage waveform thus generated across the coil 50 decreases with the decrease of the oscillation level of the crystal oscillator 100F. As for the amplitude, this is because the magnetic flux variation in the coil 50F becomes smaller as the oscillation level of the crystal oscillator 100F decreases.

The alarm issuing circuit 257 has a function (i.e., the pre-output stop state detection function) for detecting a state (i.e., the pre-output stop state) before the crystal oscillator 100F stops outputting. The alarm issuing circuit 257 is electrically connected to the coil 50F. The alarm issuing circuit 257 realizes the pre-output stop state detection function by monitoring the signal appearing in the coil 50F. The alarm issuing circuit 257 generates an alarm when the amplitude of the signal appearing in the coil 50F (the amplitude of the voltage waveform generated across the coil 50F) becomes equal to or less than a predetermined reference value $\beta 7$. The reference value $\beta 7$ is set to a value greater than the amplitude Fm of the signal appearing in the coil 50F when the amplitude of the input to the output buffer 208 becomes an input lower limit value. For example, the reference value $\beta 7$ may be $\beta 7 = 1.1 \times Fm$ or $\beta 7 > 1.1 \times Fm$. The reference value $\beta 7$ may be set in a manner similar to the reference value $\beta$ described above. That is, the reference value $\beta 7$ may be set based on the design values or an actually measured value of the input lower limit value of the output buffer 208 (the measured value of the amplitude Fm, for example) at the time of shipment.

The reference voltage generator 277 generates a voltage corresponding to the reference value $\beta 7$ used in the alarm issuing circuit 257.

Also, according to the fourth embodiment, the same effects as in the first embodiment can be obtained. That is, the output of the crystal oscillator 100F in the oscillating state can be monitored via the signal appearing in the coil 50F, and thus the pre-output stop state of the crystal oscillator 100F can be detected as well. And, at the time of detection of the pre-output stop state, the alarm can be issued, and the period up to the timing of the output stoppage of the crystal oscillator 100F can be extended by increasing the gain of the inverting amplifier 206. Further, according to the fourth embodiment, since the output of the crystal oscillator 100F in the oscillating state can be electromagnetically monitored via the signal appearing in the coil 50F, a monitoring system independent from the oscillation circuit can be formed. Therefore, according to the fourth embodiment, it is possible to monitor the output of the crystal oscillator 100F in the oscillating state in a manner that does not affect the oscillation circuit.

It is noted that, in the fourth embodiment, the coil 50F is provided in place other than on the crystal piece 10 of the crystal oscillator 100F; however, the coil 50F may be provided outside the casing 30 of the crystal oscillator 100F, for example, together with IC 200F.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention. Further, all or part of the components of the embodiments described above can be combined.

For example, in the first embodiment (the same applies to the second and third embodiments) described above, the magnet 59 has N pole and S pole positioned at the opposite ends thereof in the vertical direction; however, this is not indispensable. For example, the magnet 59 may be arranged so the N pole and S pole are positioned at the opposite ends (i.e., the opposite ends of the main vibration direction) of the X direction. In this case, the coil 50 may be provided on an arbitrary end of the magnet 59 in X direction such that the coil 50 is opposed to the end of the magnet 59 in X direction. Also, in this case, the density of the magnetic flux passing through the coil 50 (included in the magnetic flux generated from the magnet 59) is changed according to the oscillation of the crystal oscillator 100.

What is claimed is:

1. A crystal oscillator device comprising:
    a casing;
    a crystal piece provided in the casing;
    a pair of excitation electrodes provided on the crystal piece;
    a magnetic flux generating member provided on the crystal piece;
    a coil through which magnetic flux from the magnetic flux generating member passes; and
    an alarm generator configured to generate an alarm based on a signal whose amplitude is equal to or less than a reference value, the signal being generated in the coil.

2. The crystal oscillator device of claim 1, wherein the reference value is greater than the amplitude that is obtained when an output of an oscillation circuit including the crystal piece stops.

3. The crystal oscillator device of claim 1, further comprising:
    an inverting amplifier electrically connected between the pair of excitation electrodes; and
    a gain control unit configured to increase a gain of the inverting amplifier when the amplitude becomes equal to or less than the reference value.

4. The crystal oscillator device of claim 3, wherein the inverting amplifier includes an operational amplifier, a first resistor, and a second resistor, the second resistor having a resistance value larger than that of the first resistor;
    the gain control unit switches from a first state, in which an inverting terminal of the operational amplifier is electrically connected to an output terminal of the operational amplifier via the first resistor, to a second state, in which the inverting terminal is electrically connected to the output terminal via the second resistor, to increase the gain.

5. The crystal oscillator device of claim 3, wherein the inverting amplifier, the alarm generator, and the gain control unit are provided in the casing.

6. The crystal oscillator device of claim 1, wherein the coil is provided in or on the casing.

7. The crystal oscillator device of claim 1, wherein the coil is provided on the crystal piece or the casing such that a density of the magnetic flux passing through the coil changes due to the oscillation of the crystal piece.

8. The crystal oscillator device of claim 1, wherein the coil includes a coil pattern portion formed on the crystal piece or on or in the casing.

9. The crystal oscillator device of claim 1, wherein the magnetic flux generating member is a magnet.

10. The crystal oscillator device of claim 1, wherein the magnetic flux generating member is provided on one of the excitation electrodes.

11. A crystal oscillator device comprising:
    a casing;
    a crystal piece provided in the casing;
    a pair of excitation electrodes provided on the crystal piece;
    a magnetic material portion provided on the crystal piece and formed of a magnetic material;
    an electromagnet configured to generate a magnetic field that extends to the magnetic material portion;
    an alarm generator configured to generate an alarm based on a signal whose amplitude is equal to or less than a reference value, the signal being generated in a coil of the electromagnet.

12. The crystal oscillator device of claim 11, wherein the reference value is greater than the amplitude that is obtained when an output of an oscillation circuit including the crystal piece stops.

13. The crystal oscillator device of claim 11, further comprising:
    an inverting amplifier electrically connected between the pair of excitation electrodes; and
    a gain control unit configured to increase a gain of the inverting amplifier when the amplitude becomes equal to or less than the reference value.

14. The crystal oscillator device of claim 13, wherein the inverting amplifier includes an operational amplifier, a first resistor, and a second resistor, the second resistor having a resistance value larger than that of the first resistor;
    the gain control unit switches from a first state, in which an inverting terminal of the operational amplifier is electrically connected to an output terminal of the operational amplifier via the first resistor, to a second state, in which the inverting terminal is electrically connected to the output terminal via the second resistor, to increase the gain.

15. The crystal oscillator device of claim 13, wherein the inverting amplifier, the alarm generator, and the gain control unit are provided in the casing.

16. The crystal oscillator device of claim 11, wherein the magnetic material portion forms a part of or a whole of one of the excitation electrodes.

17. A method of measuring a characteristic of a crystal oscillator, the method comprising measuring, in a state where the crystal oscillator is in an oscillating state, a characteristic of an oscillation level of the crystal oscillator based on an amplitude of a signal, the signal being generated in a coil through which magnetic flux from a magnetic flux generating member passes, the magnetic flux generating member being provided on the crystal oscillator.

18. A method of measuring a characteristic of a crystal oscillator, the method comprising measuring, in a state where the crystal oscillator is in an oscillating state and a magnetic field generated by a electromagnet extends to a magnetic material portion provided on the crystal piece, a characteristic of an oscillation level of the crystal oscillator based on an amplitude of a signal, the signal being generated in a coil of the electromagnet.

* * * * *